(12) United States Patent
Fujii

(10) Patent No.: US 9,064,827 B2
(45) Date of Patent: Jun. 23, 2015

(54) METHOD FOR MANUFACTURING SEMICONDUCTOR DEVICE

(75) Inventor: Teruyuki Fujii, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 1335 days.

(21) Appl. No.: 11/806,720

(22) Filed: Jun. 4, 2007

(65) Prior Publication Data

US 2007/0292986 A1    Dec. 20, 2007

(30) Foreign Application Priority Data

Jun. 14, 2006    (JP) .................................. 2006-164873

(51) Int. Cl.
 H01L 51/40    (2006.01)
 H01L 27/32    (2006.01)
 H01L 29/45    (2006.01)
 (Continued)

(52) U.S. Cl.
 CPC ......... *H01L 27/3246* (2013.01); *H01L 27/3283* (2013.01); *H01L 29/458* (2013.01); *H01L 51/56* (2013.01); *H01L 27/1248* (2013.01)

(58) Field of Classification Search
 CPC ..................... H01L 27/3262; H01L 21/76817; H01L 27/3274
 USPC ......... 438/29, 69, 82, 99, 149, 637–640, 666; 257/59, 72, E51.005, E51.018, 257/E29.273
 See application file for complete search history.

(56) References Cited

U.S. PATENT DOCUMENTS

| 5,838,409 A | 11/1998 | Tomono et al. |
| 6,023,318 A | 2/2000 | Tomono et al. |
| 6,078,377 A | 6/2000 | Tomono et al. |

(Continued)

FOREIGN PATENT DOCUMENTS

| EP | 1 087 366 A2 | 3/2001 |
| JP | 09-189917 | 7/1997 |

(Continued)

OTHER PUBLICATIONS

M. Okinaka et al., "Fine patterning of $SiO_2$ thin film using polysilane as a precursor", 52nd Japan Society of Applied Physics and Related Societies, 24p-F-1 (Mar. 22, 2006).

(Continued)

*Primary Examiner* — David Vu
(74) *Attorney, Agent, or Firm* — Nixon Peabody LLP; Jeffrey L. Costellia

(57) ABSTRACT

An object is to provide a semiconductor device with excellent reproducibility which is manufactured at low cost. A method for manufacturing a semiconductor device includes steps of forming a first electrode over a substrate; forming an insulating layer over the substrate and the first electrode; pressing a mold against the insulating layer to form an opening in the insulating layer; separating the mold from the insulating layer in which opening is formed; hardening the insulating layer in which the opening is formed to form a partition wall; forming a light-emitting layer over the first electrode and the partition wall; and forming a second electrode over the light-emitting layer. As a method for forming the partition wall, nano-imprinting is used. An insulating layer contains polysilane. The partition wall formed of a silicon oxide film is formed by UV light irradiation and heating.

18 Claims, 22 Drawing Sheets

(51) Int. Cl.
*H01L 51/56* (2006.01)
*H01L 27/12* (2006.01)

(56) References Cited

U.S. PATENT DOCUMENTS

| | | | |
|---|---|---|---|
| 6,107,734 A | 8/2000 | Tanaka et al. | |
| 6,151,085 A | 11/2000 | Tomono et al. | |
| 6,501,227 B1 | 12/2002 | Koyama | |
| 6,517,911 B1* | 2/2003 | Matsuki | 427/551 |
| 6,740,594 B2* | 5/2004 | Lu et al. | 438/703 |
| 6,884,093 B2* | 4/2005 | Baldo et al. | 439/99 |
| 7,351,660 B2* | 4/2008 | Brewer et al. | 438/689 |
| 7,371,698 B2* | 5/2008 | Moriya et al. | 438/782 |
| 7,402,944 B2* | 7/2008 | Jeong et al. | 313/503 |
| 2002/0074936 A1 | 6/2002 | Yamazaki et al. | |
| 2004/0185300 A1* | 9/2004 | Hatwar et al. | 428/690 |
| 2005/0180680 A1* | 8/2005 | Kong | 385/14 |
| 2005/0266693 A1* | 12/2005 | Maekawa | 438/720 |
| 2007/0065960 A1* | 3/2007 | Fukshima et al. | 438/42 |
| 2007/0205418 A1 | 9/2007 | Takahashi | |
| 2007/0287207 A1 | 12/2007 | Fujii | |
| 2009/0039563 A1* | 2/2009 | Okinaka et al. | 264/446 |
| 2013/0273675 A1 | 10/2013 | Takahashi | |

FOREIGN PATENT DOCUMENTS

| | | |
|---|---|---|
| JP | 10-073807 | 3/1998 |
| JP | 11-329748 | 11/1999 |
| JP | 2000-294378 | 10/2000 |
| JP | 2001-351787 A | 12/2001 |
| JP | 2003-100609 | 4/2003 |
| JP | 2005-013985 | 1/2005 |
| JP | 2005-063785 A | 3/2005 |
| JP | 2005-097371 | 4/2005 |
| JP | 2005-158584 | 6/2005 |
| JP | 2005-158584 A | 6/2005 |
| JP | 2006-005109 | 1/2006 |
| JP | 2006-007546 | 1/2006 |
| JP | 2006-185789 | 7/2006 |
| WO | WO-2007/026605 | 3/2007 |

OTHER PUBLICATIONS

Xing Cheng, et al.—"High-resolution organic polymer light-emitting pixels fabricated by imprinting technique", J. Vac. Sci. Technol. B (Journal of Vacuum Science & Technology B), vol. 20, No. 6, pp. 2877-2880, dated Nov./Dec. 2002.

International Search Report (Application No. PCT/JP2007/061404; PCT9750), dated Jul. 24, 2007.

Written Opinion (Application No. PCT/JP2007/061404; PCT9750), dated Jul. 24, 2007.

M. Okinaka et al., "Fine patterning of $SiO_2$ thin film using polysilane as a precursor", 53rd Japan Society of Applied Physics and Related Societies, 24p-F-1 (Mar. 22, 2006).

* cited by examiner

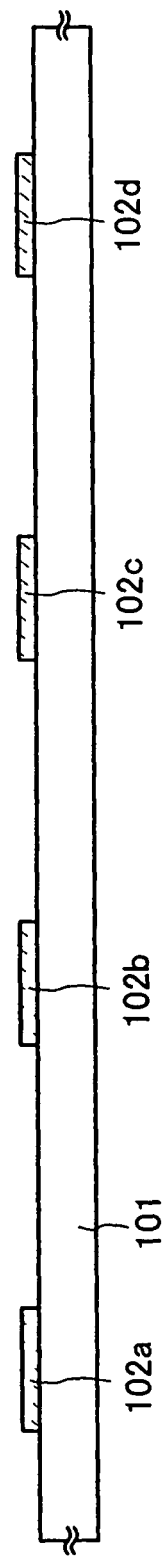
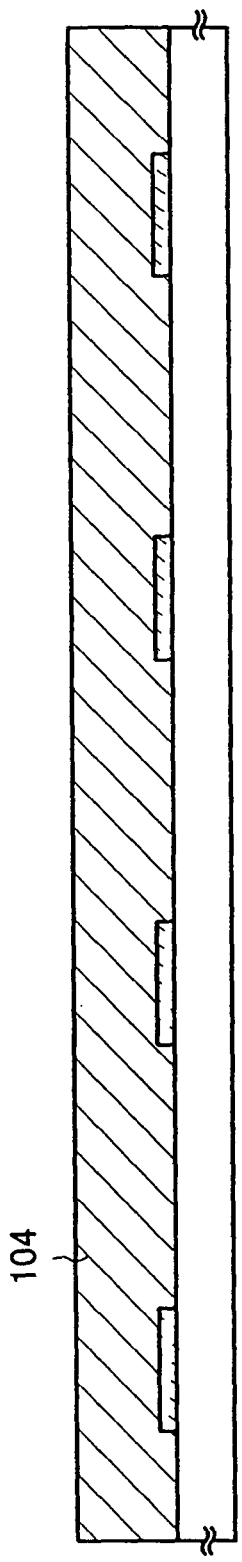
FIG. 1A
FIG. 1B

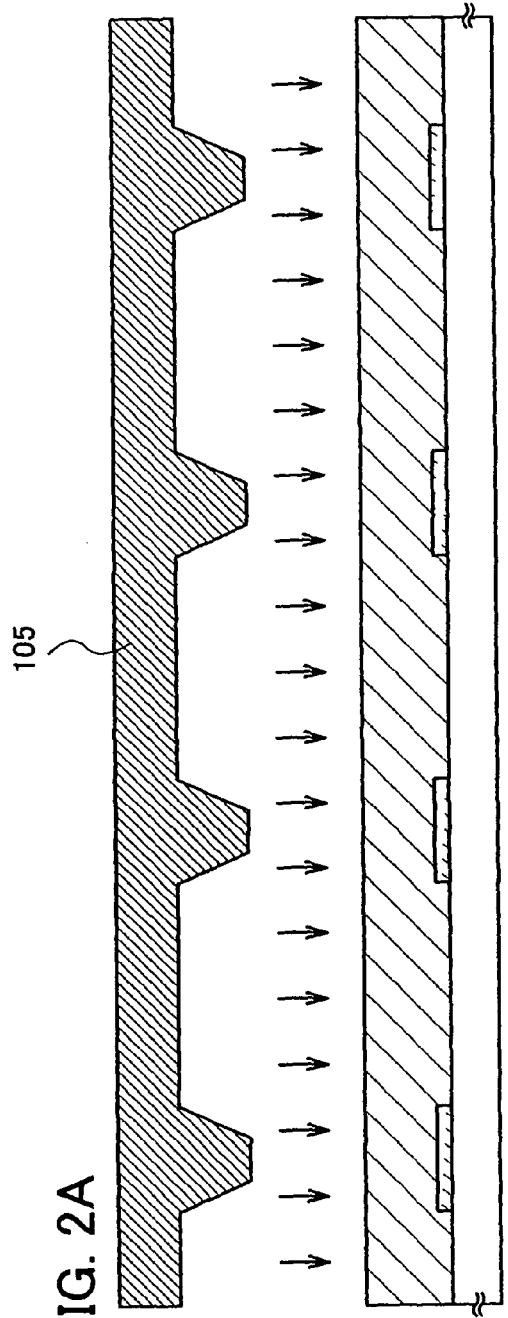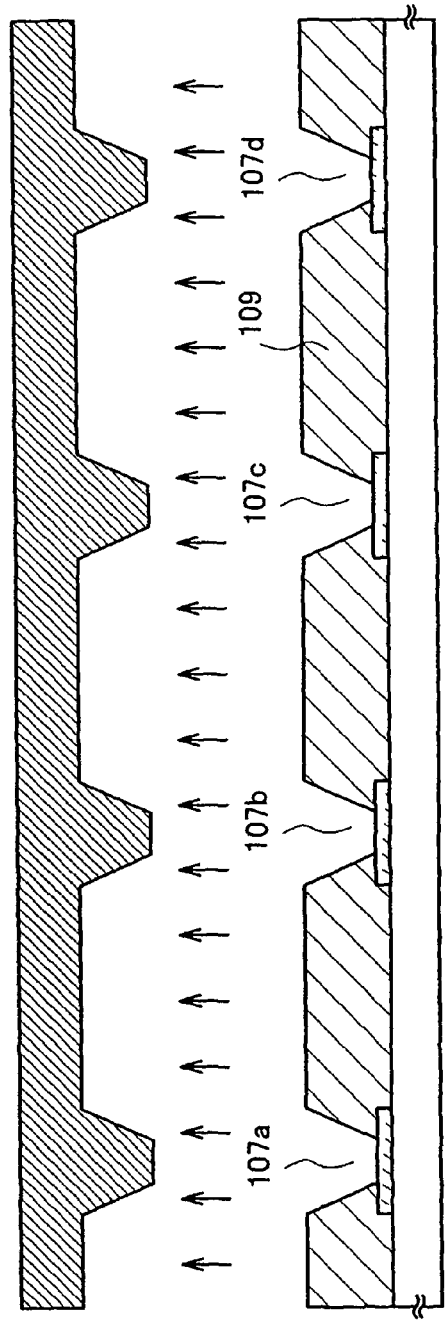

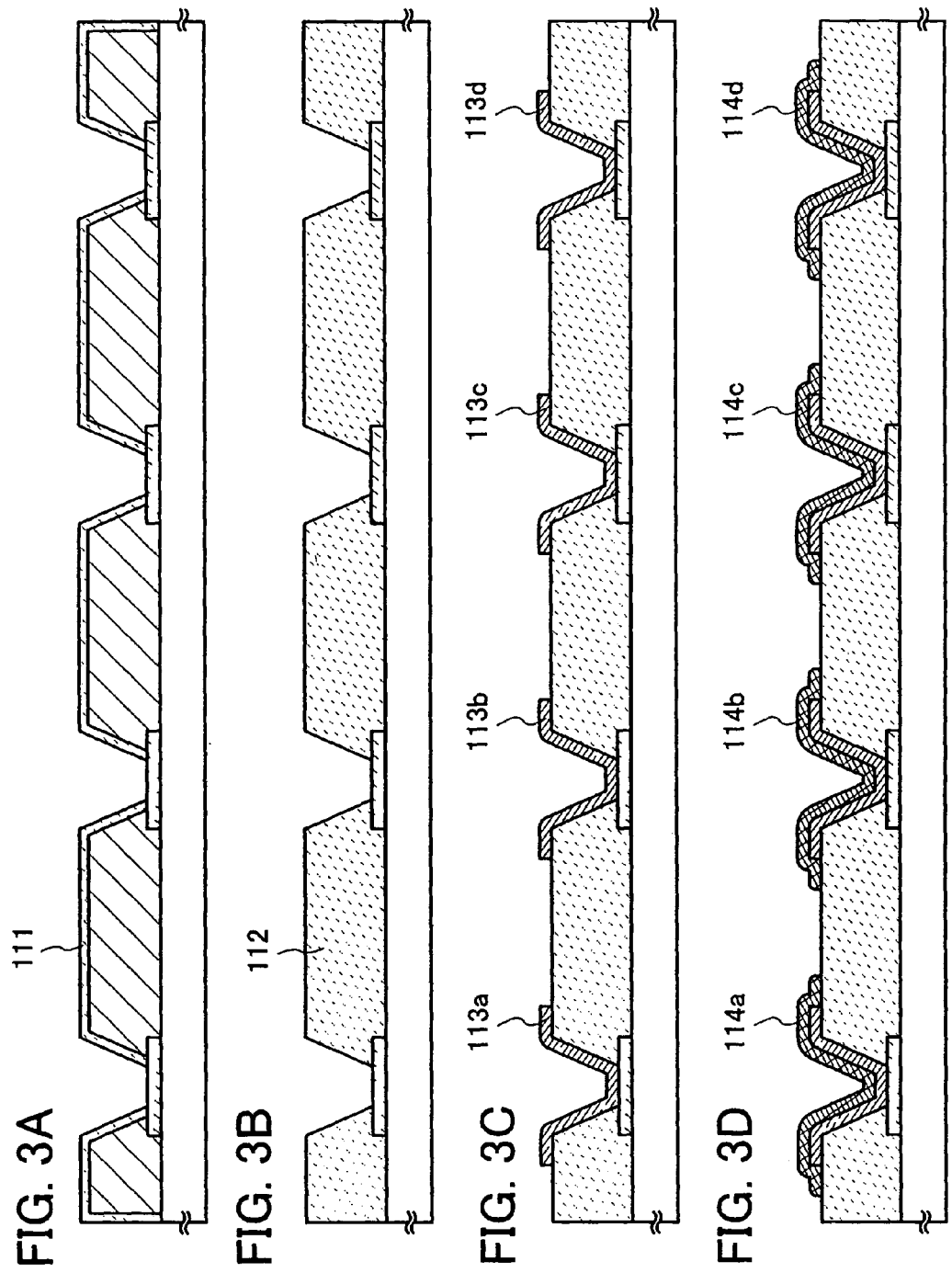

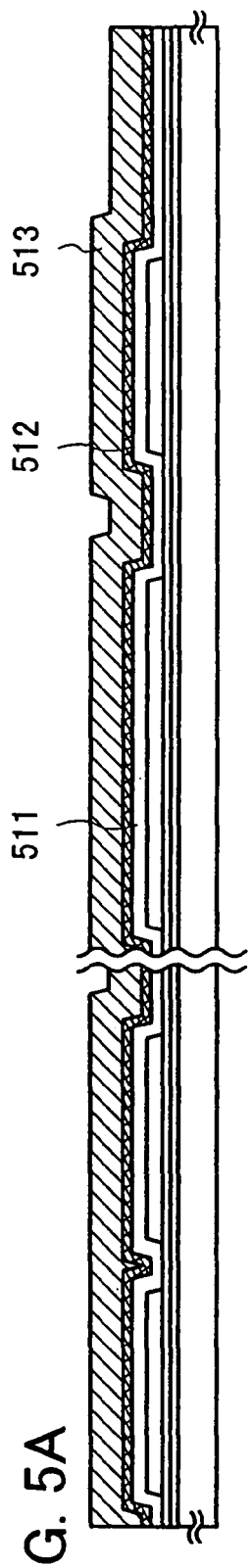
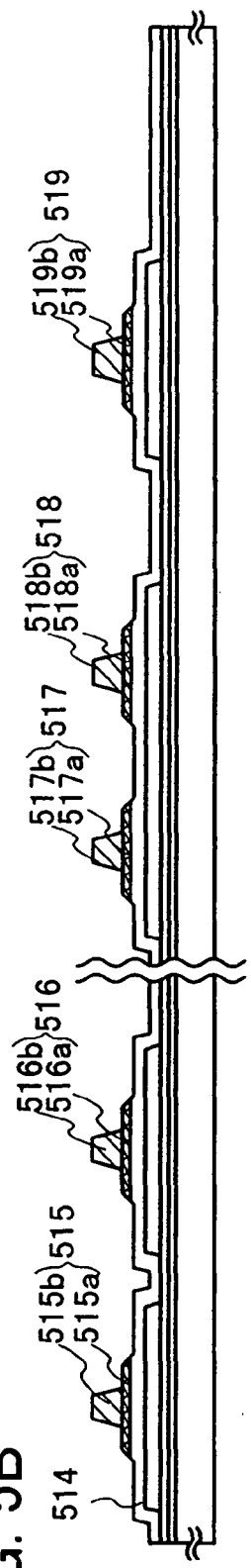
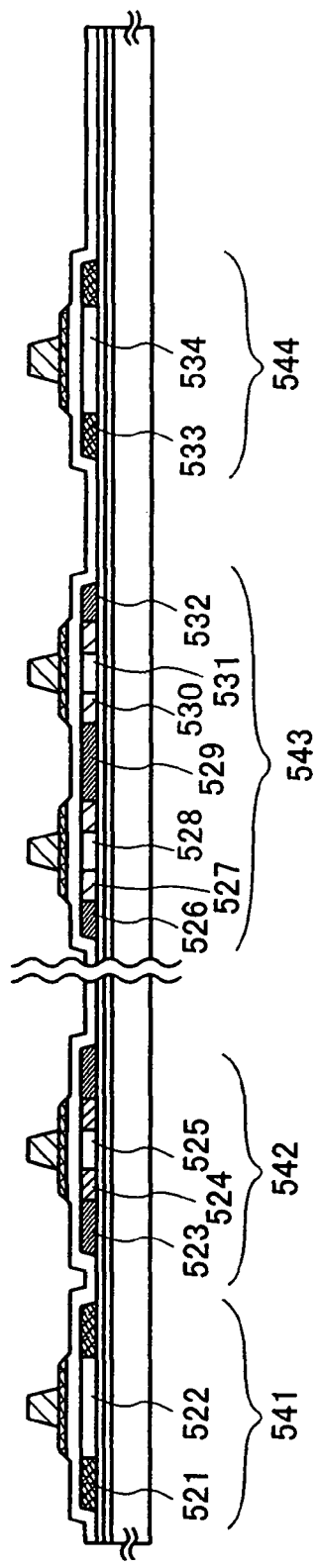

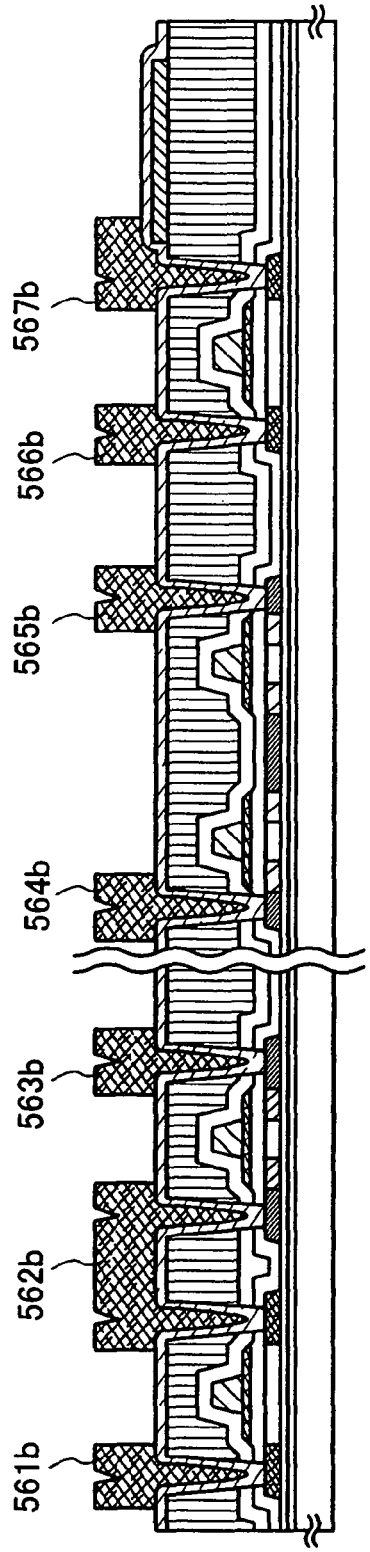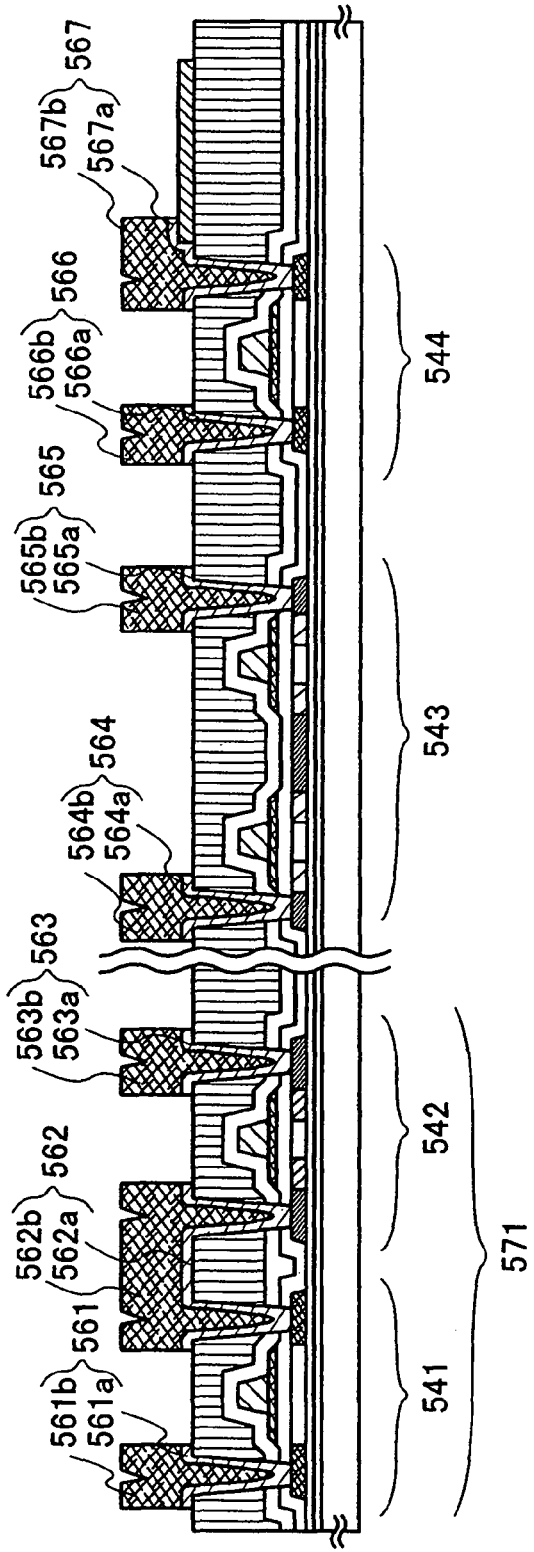

METHOD FOR MANUFACTURING SEMICONDUCTOR DEVICE

TECHNICAL FIELD

The present invention relates to a semiconductor device and a method for manufacturing the same.

BACKGROUND ART

A plurality of pixels are formed in a display device such as an organic EL (Electro Luminescence) display, an inorganic EL display, a liquid crystal display, a plasma display, or a surface-conduction electron-emitter display (SED).

A great number of resin materials are used as a material for separating a plurality of pixels (hereinafter, referred to as a partition wall) (see Patent Document 1: Japanese Published Patent Application No. 2000-294378).

An organic resin (for example, polyimide or the like) is preferable as a material for a partition wall. However, an organic resin is inferior in heat resistance to many inorganic matters and has comparatively high hygroscopicity. Therefore, a small amount of moisture discharged from a partition wall by heat of a display device might cause decrease in luminance of the display device.

In particular, as a display device, a light-emitting display device in which a material performing light emission referred to as electroluminescence (hereinafter, also referred to as "EL") is given. Moisture, gas, or the like generated from a resin material used for a partition wall is considered to be one of causes of deterioration in light-emitting characteristics of an electroluminescent element (an EL element), especially an organic EL element.

Therefore, from the perspective of an insulating property, heat resistance, hygroscopicity, or the like, an inorganic material such as silicon oxide can be given as a more preferable material for a partition wall.

DISCLOSURE OF INVENTION

In order to form a partition wall with the use of an inorganic material such as silicon oxide, an inorganic material film has to be formed and the formed inorganic material film has to be processed.

For example, in the case of using a silicon oxide film, a partition wall can be formed by the following method.

That is, the following method is given: a method in which a resist is formed over a silicon oxide film and etching is performed using a solution containing fluorine, or a method in which a silicon oxide film is formed, pressure is applied on the silicon oxide film with a mold by an imprinting device while performing heating.

The method in which etching is performed using a solution containing fluorine has a defect in that a wiring is damaged due to the solution containing fluorine. In addition, the method in which pressure is applied with a mold by an imprinting device while heating has a defect in that a silicon oxide film has to be heated to a temperature higher than a glass transition point of silicon oxide.

According to one feature of the present invention, a method in which a partition wall is formed by nano-imprinting is used, and as a method for forming a partition wall with the use of a silicon oxide film, an insulating film containing polysilane is formed first, and then the partition wall formed of the silicon oxide film is formed by UV light irradiation and heating.

When a partition wall is formed by nano-imprinting, a partition wall which is as precise as the one formed with a stepper apparatus, that is, a partition wall with precision of nanometer (nm) can be formed. In addition, since a partition wall is formed using a mold (a casting mold) in nano-imprinting, a plurality of partition walls can be formed with excellent reproducibility, the partition wall has few variations, and manufacturing cost can be reduced.

The present invention relates to a method for manufacturing a semiconductor device, in which a first electrode is formed over a substrate; an insulating layer containing polysilane is formed over the substrate and the first electrode; a mold is pressed against the insulating layer to form an opening in the insulating layer over the first electrode; the mold is separated from the insulating layer in which the opening is formed; the insulating layer in which the opening is formed is hardened to form a partition wall; a light-emitting layer is formed over the first electrode and the partition wall; and a second electrode is formed over the light-emitting layer.

In the present invention, the insulating layer is formed by UV light irradiation and heating.

In the present invention, the mold is formed of a metal material or an insulating material, and a depression is formed on a surface of the mold.

In the present invention, the surface of the insulating layer in which the opening is formed is hardened before the partition wall is formed.

It is to be noted that, in this specification, a semiconductor device means an element and device in general, which operates by utilization of a semiconductor, and an electronic optical device including a light-emitting device or the like in which a semiconductor element is included and an electronic appliance mounted with the electronic optical device are included in the category.

By the present invention, a partition wall using an inorganic material can be formed by a simple method with excellent reproducibility. Accordingly, a highly durable display device in which decreasing rate of luminance is low can be manufactured.

BRIEF DESCRIPTION OF THE DRAWINGS

In the accompanying drawings:

FIGS. 1A and 1B are views each illustrating a manufacturing process of a semiconductor device of the present invention;

FIGS. 2A and 2B are views each illustrating a manufacturing process of a semiconductor device of the present invention;

FIGS. 3A to 3D are views each illustrating a manufacturing process of a semiconductor device of the present invention;

FIGS. 5A to 5C are views each illustrating a manufacturing process of a semiconductor device of the present invention;

FIGS. 8A and 8B are views each illustrating a manufacturing process of a semiconductor device of the present invention;

BEST MODE FOR CARRYING OUT THE INVENTION

Embodiment Mode

Figure 4A:
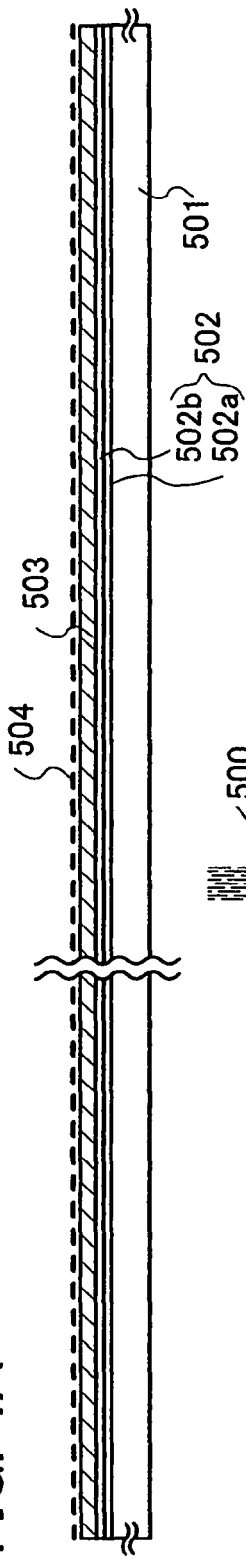
FIGS. 4A to 4D are views each illustrating a manufacturing process of a semiconductor device of the present invention.

Embodiment Mode of the present invention will be hereinafter explained with reference to the accompanying drawings. However, the present invention can be carried out in many different modes, and it is easily understood by those skilled in the art that modes and details of the present invention can be modified in various ways without departing from the purpose and the scope of the present invention. Therefore, the present invention should not be interpreted as being limited to the description of Embodiment Mode. It is to be noted that, in the drawings hereinafter shown, the same portions or portions having similar functions are denoted by the same reference numerals, and repeated explanation thereof will be omitted.

In this embodiment mode, a manufacturing process of a light-emitting element of a light-emitting display device by the present invention will be explained with reference to FIGS. 1A and 1B, FIGS. 2A and 2B, FIGS. 3A to 3C, and FIG. 22.

First, first electrodes 102 (102a, 102b, 102c, 102d, and so on) are formed over a substrate 101 (see FIG. 1A). For example, glass, quartz, or the like can be used for the substrate 101. It is to be noted that a base insulating film may be formed over the substrate 101 before the first electrodes 102 are formed.

A metal, an alloy, a conductive compound, a mixture of these, or the like can be used for the first electrodes 102 and second electrodes 114 (114a, 114b, 114c, 114d, and so on) to be formed in a subsequent step. Specifically, indium oxide-tin oxide (Indium Tin Oxide which is also referred to as "ITO"), indium oxide-tin oxide containing silicon or silicon oxide, indium oxide-zinc oxide (Indium Zinc Oxide which is also referred to as "IZO"), tungsten oxide-indium oxide containing tungsten oxide and zinc oxide, or the like is given, for example. Such a conductive metal oxide film is generally formed by sputtering. For example, indium oxide-zinc oxide (IZO) can be formed by sputtering using a target in which zinc oxide is added at 1 to 20 wt % to indium oxide. In addition, indium oxide-tungsten oxide containing zinc oxide can be formed by sputtering using a target in which tungsten oxide is contained at 0.5 to 5 wt % and zinc oxide is contained at 0.1 to 1 wt % in indium oxide.

Besides, aluminum (Al), silver (Ag), gold (Au), platinum (Pt), nickel (Ni), tungsten (W), chromium (Cr), molybdenum (Mo), iron (Fe), cobalt (Co), copper (Cu), palladium (Pd), nitride of a metal material (for example, titanium nitride (TiN)), or the like can be used as the first electrodes 102 and the second electrodes 114.

It is to be noted that, in the case where both the first electrodes 102 and the second electrodes 114, or either the first electrodes 102 or the second electrodes 114 are light-transmitting electrodes, even when the electrodes are formed of a material with low transmittance of visible light, the electrodes can be used as light-transmitting electrodes by a method in which the electrodes are formed to a thickness of 1 to 50 nm, preferably, 5 to 20 nm. Further, the electrodes can be formed by vacuum evaporation, CVD, or a sol-gel method, besides sputtering.

However, since light emission is extracted outside through the first electrodes 102 or the second electrodes 114, it is necessary for at least either the first electrodes 102 or the second electrodes 114 to be formed of a light-transmitting material. In addition, it is preferable that the material be selected so that a work function of the first electrodes 102 is higher than that of the second electrodes 114. Furthermore, it is not necessary for each of the first electrodes 102 and the second electrodes 114 to have a one-layer structure, but may have a structure including two or more layers.

Then, as shown in FIG. 1B, an insulating layer 104 containing polysilane is formed over the substrate 101 and the first electrodes 102.

Subsequently, a casting mold (also referred to as a mold) 105 is pushed against (pressed against) the insulating layer 104, and heating is performed (see FIG. 2A). Accordingly, openings 107 (107a, 107b, 107c, 107d, and so on) are formed in the insulating layer 104.

The mold 105 is formed of a metal material or an insulating material such as quartz, and a depression is formed in advance on its surface. The depression on the surface is formed using electron beam lithography, for example.

Next, as shown in FIG. 2B, the mold 105 is separated from the insulating layer 104. For example, the mold 105 can be separated from the insulating layer 104 by application of ultrasonic wave to the insulating layer 104 while suppressing deformation of the insulating layer 104. The mold 105 is separated from the insulating layer 104, so that an insulating layer 109 of which pattern is formed can be formed.

Here, a surface 111 of the insulating layer 109 is hardened by oxygen plasma or the like, if necessary (see FIG. 3A). When the insulating layer 109 is processed by oxygen plasma or the like, only the surface is oxidized to be hardened and deformation can be prevented. Furthermore, since the surface 111 is hardened, desorption of moisture or gas from the inside of the insulating layer 109 can be prevented. In addition, even when the insulating layer 109 is processed by oxygen plasma or the like, the inside of the insulating layer 109 is not oxidized but only the surface is oxidized.

Subsequently, UV light irradiation is performed to heat (postbake) the insulating layer 109, so that the insulating layer 109 is completely vitrified, so that a partition wall 112 is formed (see FIG. 3B).

Figure 22:
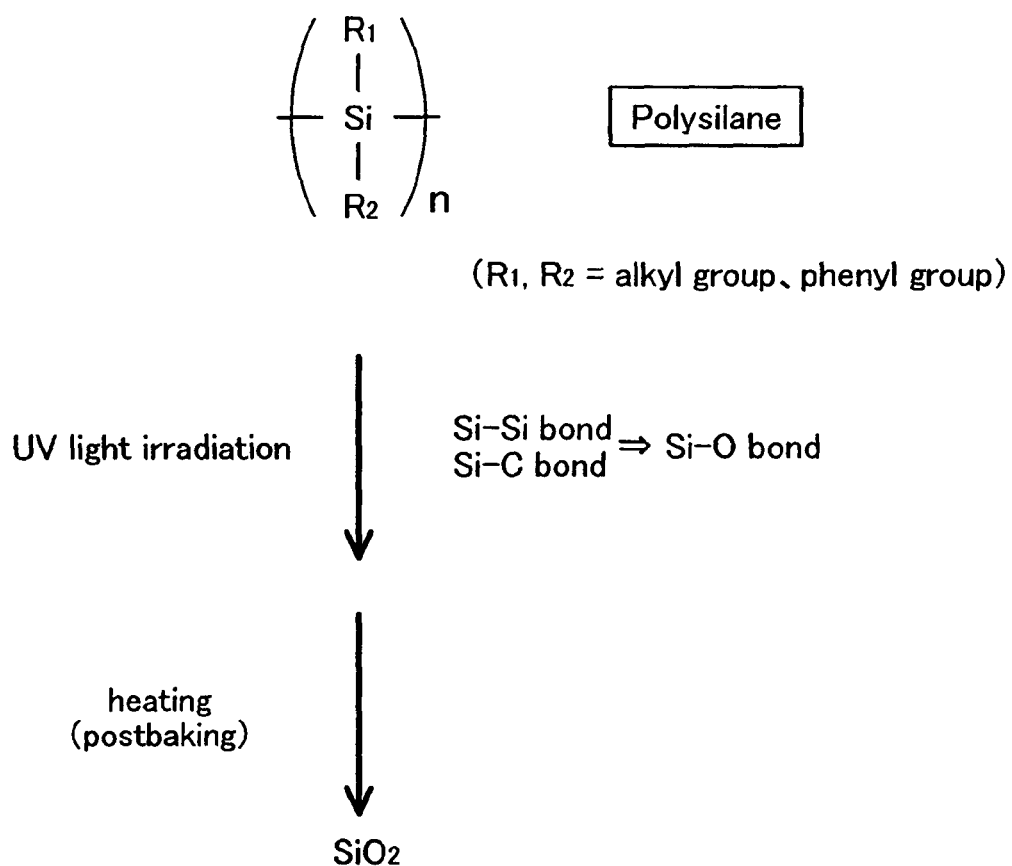
FIG. 22 is a view illustrating a manufacturing process of a semiconductor device of the present invention.

A mechanism in which the insulating layer 109 containing polysilane is hardened by UV light irradiation and heating, so that the partition wall 112 including a silicon oxide film is formed is explained with reference to FIG. 22.

First, the insulating layer 109 containing polysilane in which a Si—Si bond and a Si—C bond are included is irradiated with ultraviolet light (UV light). Since oxygen in a high energy state is generated by the UV light irradiation, a Si—O bond is formed. A vitrified silicon oxide film can be formed by further heating (postbaking).

It is to be noted that, as a substance that can be used as polysilane, the following can be used, for example; however, the substance is not limited thereto, and any substance may be used as long as it can be shaped with a mold pressed against, by heating.

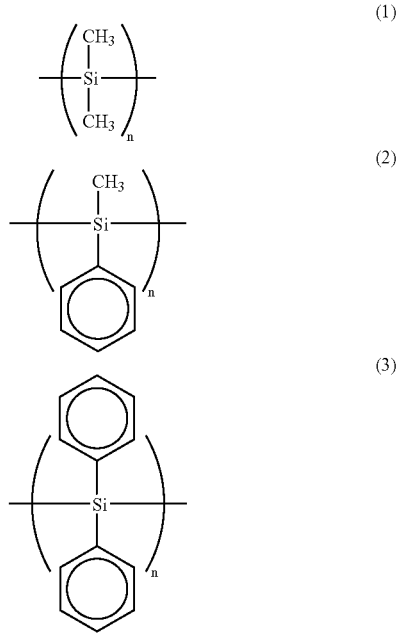

Subsequently, the light-emitting layers 113 (113a, 113b, 113c, 113d, and so on) are formed over the first electrodes 102 and the partition wall 112. In this embodiment mode, an organic compound is used for the light-emitting layer 113.

The following material can be used for the light-emitting layer 113 formed of an organic compound. For example, as a light-emitting material which emits red light, $Alq_3$ (tris(8-quinolinolato)aluminum):DCM1 (4-(dicyanomethylene)-2-methyl-6-(p-dimethylaminostyryl)-4H-pyran), $Alq_3$:rubrene:BisDCJTM, or the like is used. As a light-emitting material which emits green light, $Alq_3$:DMQD (N,N'-dimethylquinacridone), $Alq_3$:coumarin 6, or the like is used. As a light-emitting material which emits blue light, α-NPD, tBu-DNA, or the like is used.

The present invention can be applied to the case where an inorganic compound is used for the light-emitting layer 113.

An inorganic EL element using an inorganic compound as a light-emitting material is classified into a dispersion type inorganic EL element and a thin-film type inorganic EL element, depending on its element structure. The former and the latter are different in that the former has an electroluminescent layer where particles of a light-emitting material are dispersed in a binder whereas the latter has an electroluminescent layer formed of a thin film of the light-emitting material. However, they are in common in that they need electrons accelerated by a high electric field. It is to be noted that, as a mechanism of light emission that is obtained, there are donor-acceptor recombination type light emission that utilizes a donor level and an acceptor level and localized type light emission that utilizes inner-shell electron transition of a metal ion. In general, the dispersion type inorganic EL element exhibits the donor-acceptor recombination type light emission, and the thin-film type inorganic EL element exhibits the localized type light emission.

A light-emitting material which can be used in the present invention includes a base material and an impurity element which becomes an emission center. By the change of the impurity element to be contained, light emission of various colors can be obtained. Various methods such as a solid-phase method or a liquid-phase method (a coprecipitation method) can be used for forming the light-emitting material. In addition, an evaporative decomposition method, a double decomposition method, a method by heat decomposition reaction of a precursor, a reversed micelle method, a method in which such a method and high temperature baking are combined, a liquid-phase method such as a freeze-drying method, or the like can be used.

A solid-phase method is a method in which a base material and an impurity element or a compound containing an impurity element are weighed, they are mixed in a mortar, the mixture is heated and baked in an electronic furnace to be reacted, so that the impurity element is contained in the base material. The baking temperature is preferably 700 to 1500° C. This is because the solid reaction does not progress when the temperature is too low, whereas the base material is decomposed when the temperature is too high. It is to be noted that, although the baking may be carried out in a powder state, it is preferable that the baking be carried out in a pellet state. Although the solid-phase method needs baking at a comparatively high temperature, the solid-phase method is easy; therefore, high productivity is obtained and the solid-phase method is suitable for mass production.

A liquid-phase method (a coprecipitation method) is a method in which a base material or a compound containing a base material and an impurity element or a compound containing an impurity element are reacted in a solution, dried, and then baked. Particles of a light-emitting material are uniformly distributed, and the reaction can progress even when the grain size is small and the baking temperature is low.

As a base material used for a light-emitting material, sulfide, oxide, or nitride can be used. As sulfide, for example, the following can be used: zinc sulfide (ZnS), cadmium sulfide (CdS), calcium sulfide (CaS), yttrium sulfide ($Y_2S_3$), gallium sulfide ($Ga_2S_3$), strontium sulfide (SrS), barium sulfide (BaS), or the like. As oxide, for example, zinc oxide (ZnO), yttrium oxide ($Y_2O_3$), or the like can be used. As nitride, for example, aluminum nitride (AlN), gallium nitride (GaN), indium nitride (InN), or the like can be used. Furthermore, zinc selenide (ZnSe), zinc telluride (ZnTe), or the like can also be used. Alternatively, a ternary mixed crystal such as calcium sulfide-gallium ($CaGa_2S_4$), strontium sulfide-gallium ($SrGa_2S_4$), or barium sulfide-gallium ($BaGa_2S_4$) may be used.

For an emission center of the localized type light emission, manganese (Mn), copper (Cu), samarium (Sm), terbium (Tb), erbium (Er), thulium (Tm), europium (Eu), cerium (Ce), praseodymium (Pr), or the like can be used. It is to be noted that a halogen element such as fluorine (F) or chlorine (Cl) may be added for charge compensation.

On the other hand, as an emission center of the donor-acceptor recombination type light emission, a light-emitting material containing a first impurity element which forms a donor level and a second impurity element which forms an acceptor level can be used. As the first impurity element, for example, fluorine (F), chlorine (Cl), aluminum (Al), or the like can be used. As the second impurity element, for example, copper (Cu), silver (Ag), or the like can be used.

In the case where the light-emitting material for the donor-acceptor recombination type light emission is synthesized by a solid-phase method, each of a base material, a first impurity element or a compound containing a first impurity element, and a second impurity element or a compound containing a second impurity element is weighed and mixed in a mortar, and then, heated and baked in an electronic furnace. The above-described base material can be used for the base material. As the first impurity element or the compound containing the first impurity element, for example, fluorine (F), chlorine (Cl), aluminum sulfide ($Al_2S_3$), or the like can be used. As the second impurity element or the compound containing the second impurity element, for example, copper (Cu), silver (Ag), copper sulfide ($Cu_2S$), silver sulfide ($Ag_2S$), or the like can be used. The baking temperature is preferably 700 to 1500° C. This is because the solid reaction does not progress when the temperature is too low, whereas the base material is decomposed when the temperature is too high. It is to be noted that, although the baking may be carried out in a powder state, it is preferable that the baking be carried out in a pellet state.

As an impurity element in the case of utilizing solid-phase reaction, a compound containing a first impurity element and a second impurity element may be used. In this case, the impurity element is easily diffused and solid-phase reaction easily progresses; thus, a uniform light-emitting material can be obtained. Moreover, since an unnecessary impurity element does not enter, a light-emitting material with high purity can be obtained. As the compound containing the first impurity element and the second impurity element, for example, copper chloride (CuCl), silver chloride (AgCl), or the like can be used.

It is to be noted that these impurity elements may be contained in the base material at concentrations of 0.01 to 10 atom %, preferably, 0.05 to 5 atom %.

In the case of the thin-film type inorganic EL element, a light-emitting layer, which contains the above-described light-emitting material, can be formed by a vacuum evaporation method such as a resistance heating evaporation method or an electron beam evaporation (EB evaporation) method; a physical vapor deposition method (PVD) such as a sputtering method; a chemical vapor deposition method (CVD) such as an metal organic CVD method or a low-pressure hydride transport CVD method; an atomic layer epitaxy method (ALE); or the like.

Subsequently, the second electrodes 114 (114a, 114b, 114c, 114d, and so on) are formed over the light-emitting layers 113 (see FIG. 3D). A material and a formation step of the second electrodes 114 are the same as those of the first electrodes 102.

It is to be noted that this embodiment mode can be combined with embodiments, if necessary.

Embodiment 1

An example of using a method for manufacturing a semiconductor device of the present invention will be explained with reference to FIGS. 4A to 4D, FIGS. 5A to 5C, FIGS. 6A to 6C, FIGS. 7A and 7B, FIGS. 8A and 8B, FIGS. 9A and 9B, FIG. 10, FIG. 11, and FIG. 12.

First, as shown in FIG. 4A, a base film 502 is formed over a substrate 501. As the substrate 501, for example, a glass substrate such as barium borosilicate glass or alumino borosilicate glass, a quartz substrate, a stainless steel substrate, or the like can be used. In addition, a substrate made of plastic typified by PET (polyethylene terephthalate), PES (polyethersulfone), or PEN (polyethylene naphthalate), or a substrate made of a flexible synthetic resin such as acrylic can be used.

The base film 502 is provided in order to prevent an alkali metal such as Na or an alkaline earth metal contained in the substrate 501 from diffusing into a semiconductor film and having an adverse effect on characteristics of a semiconductor element.

For the base film 502, silicon oxide, silicon nitride, silicon oxide containing nitrogen, silicon nitride containing oxygen, or the like can be used and may be formed of a single layer or a stacked layer structure such as a two-layer structure or a three-layer structure. In the case of using a substrate containing some alkali metals or alkali earth metals, such as a glass substrate, a stainless steel substrate, or a plastic substrate, it is effective to provide the base film from the viewpoint of prevention of diffusion of an impurity; however, in the case where diffusion of the impurity is not a big problem, such as the case of using a quartz substrate, the base film is not necessarily provided.

In this embodiment, as a lower base film 502a, a silicon nitride film containing oxygen is formed to have a thickness of 50 nm over the substrate, using $SiH_4$, $NH_3$, $N_2O$, $N_2$, and $H_2$ as reactive gases, and as an upper base film 502b, a silicon oxide film containing nitrogen is formed to a thickness of 100 nm over the lower base film 502a, using $SiH_4$ and $N_2O$ as reactive gases. Alternatively, the thickness of the silicon nitride film containing oxygen may be 140 nm and the thickness of the silicon oxide film containing nitrogen that is stacked thereover may be 100 nm.

Next, a semiconductor film 503 is formed over the base film 502. The thickness of the semiconductor film 503 is 25 to 100 nm (preferably, 30 to 60 nm). It is to be noted that not only silicon (Si) but also silicon germanium (SiGe) can be used for the semiconductor. It is preferable that a concentration of germanium be approximately 0.01 to 4.5 atomic % in the case of using silicon germanium.

For the semiconductor film 503, an amorphous semiconductor formed by a vapor deposition method or a sputtering method using a semiconductor material gas such as silane or germane; a semi-amorphous semiconductor (also referred to as microcrystal, and hereinafter, referred to as "SAS"); or the like can be used.

The semi-amorphous semiconductor (SAS) has an intermediate structure between an amorphous structure and a crystalline structure (including a single crystal and a polycrystal) and a third state that is stable in terms of free energy, and includes a crystalline region with short-range order and lattice distortion. At least part of a film includes a crystalline region of 0.5 to 20 nm. When silicon is contained as a main component, Raman spectrum shifts to a wave number side lower than 520 $cm^{-1}$.

The diffraction peaks of (111) and (220) which are thought to be derived from a silicon (Si) crystalline lattice are observed by X-ray diffraction. Hydrogen or halogen of at least 1 atomic % or more is contained as a material for terminating dangling bonds.

SAS is formed by glow discharge decomposition (plasma CVD) of a gas containing silicon. As the gas containing silicon, $Si_2H_6$, $SiH_2Cl_2$, $SiHCl_3$, $SiCl_4$, $SiF_4$, or the like can be used in addition to $SiH_4$. Also, $F_2$ and $GeF_4$ may be mixed. The gas containing silicon may be diluted with $H_2$ or $H_2$ and one or more kinds of rare gas elements selected from He, Ar, Kr, and Ne.

A dilution ratio is in the range of 2 to 1000 times, pressure is in the range of 0.1 to 133 Pa, and a power supply frequency is 1 to 120 MHz, preferably, 13 to 60 MHz. The substrate heating temperature is preferably less than or equal to 300° C., and SAS can also be formed at substrate heating temperatures of 100 to 200° C.

Here, as an impurity element that is introduced mainly in forming a film, an impurity which is derived from an atmospheric component, such as oxygen, nitrogen, or carbon, is desirably contained at less than or equal to $1 \times 10^{20}$ $cm^{-3}$. In particular, an oxygen concentration is preferably less than or equal to $5 \times 10^{19}$ $cm^{-3}$, more preferably, less than or equal to $1 \times 10^{19}$ $cm^{-3}$.

Moreover, when a rare gas element such as helium, argon, krypton, or neon is contained to further increase the lattice distortion, stability can be enhanced, and a favorable SAS can be obtained. In addition, as the semiconductor film, a SAS layer formed using a hydrogen-based gas may be stacked over a SAS layer formed using a fluorine-based gas.

The amorphous semiconductor is typified by hydrogenated amorphous silicon. Alternatively, as described above, a semi-amorphous semiconductor or a semiconductor including a crystalline phase as part of its semiconductor film can be used.

In this embodiment, as the semiconductor film 503, an amorphous silicon film is formed to a thickness of 54 nm by a plasma CVD method.

Next, a metal element that promotes crystallization of a semiconductor is introduced into the semiconductor film 503. A method of introducing the metal element into the semiconductor film 503 is not particularly limited, as long as it is a method by which the metal element can be contained in a surface or inside of the semiconductor film 503. For example, a sputtering method, a CVD method, a plasma treatment method (including a plasma CVD method), an adsorption method, or a method of adding a metal salt solution can be used.

Of the methods, the method using a solution is useful in that the method is simple and control of a concentration of a metal element is easy. At this time, it is desirable that an oxide film be formed by UV light irradiation in an oxygen atmosphere, thermal oxidation, a treatment with ozone water containing a hydroxyl radical or hydrogen peroxide, or the like in order to improve surface wettability of the semiconductor film 503 and spread the solution over the entire surface of the amorphous semiconductor film.

As the metal element that promotes crystallization of a semiconductor, one or a plurality of elements selected from nickel (Ni), germanium (Ge), iron (Fe), palladium (Pd), tin (Sn), lead (Pd), cobalt (Co), platinum (Pt), copper (Cu), and gold (Au) can be used. In this embodiment, nickel (Ni) is used as the metal element, and a nickel acetic acid solution which is a liquid phase is added over the surface of the semiconductor film 503 by a spin coating method as a solution 504 containing the metal element (see FIG. 4A).

Next, in a nitrogen atmosphere, the semiconductor film 503 is retained at 450 to 500° C. for an hour, so that hydrogen in the semiconductor film 503 is released. This is for reducing the threshold energy in the following crystallization by purposeful formation of dangling bonds in the semiconductor film 503.

Then, the semiconductor film 503 is crystallized by heat treatment at 550 to 600° C. for 4 to 8 hours in a nitrogen atmosphere, so that a crystalline semiconductor film 505 is obtained. By the metal element, the temperature for crystallization of the semiconductor film 503 can be set at 550 to 600° C., which is comparatively low.

Figure 4B:
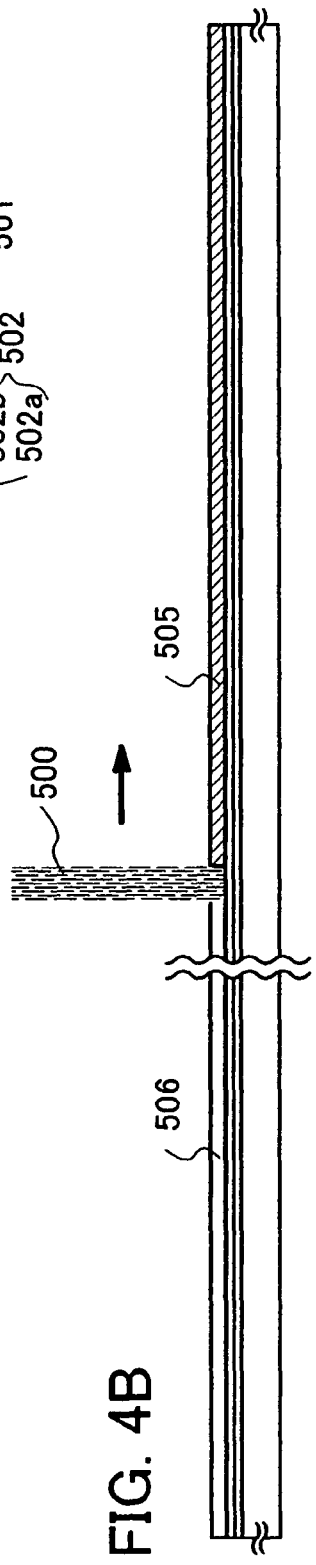

Next, the crystalline semiconductor film 505 is irradiated with a linear laser beam 500, so that the crystallinity is further improved (see FIG. 4B).

In the case where laser crystallization is performed, heat treatment at 500° C. for an hour may be performed to the crystalline semiconductor film 505 before the laser crystallization, in order to increase resistance of the crystalline semiconductor film 505 to a laser.

For the laser crystallization, a continuous wave laser can be used, or as a pseudo CW laser, a pulse oscillation laser with a repetition rate of greater than or equal to 10 MHz, preferably, greater than or equal to 80 MHz can be used.

Specifically, as the continuous wave laser, the following can be given: an Ar laser, a Kr laser, a $CO_2$ laser, a YAG laser, a $YvO_4$ laser, a YLF laser, a $YAlO_3$ laser, a $GdVO_4$ laser, a $Y_2O_3$ laser, a ruby laser, an alexandrite laser, a Ti: sapphire laser, a helium cadmium laser, or the like.

As the pseudo CW laser, the following can be used as long as pulse oscillation with a repetition rate of greater than or equal to 10 MHz, preferably, greater than or equal to 80 MHz is possible: the pulse oscillation laser such as an Ar laser, a Kr laser, an excimer laser, a $CO_2$ laser, a YAG laser, a $Y_2O_3$ laser, a $YVO_4$ laser, a YLF laser, a $YAlO_3$ laser, a $GdVO_4$ laser, a glass laser, a ruby laser, an alexandrite laser, a Ti:sapphire laser, a copper vapor laser, or a gold vapor laser.

Such a pulse oscillation laser eventually shows an effect equivalent to that of a continuous wave laser when the repetition rate is increased.

For example, in the case of using a solid-state laser capable of continuous oscillation, a crystal with a large grain diameter can be obtained by irradiation with laser light of the second to fourth harmonics. Typically, it is desirable to use the second harmonic (532 nm) or the third harmonic (355 nm) of the YAG laser (fundamental wave of 1064 nm). For example, laser light emitted from a continuous wave YAG laser is converted into a high harmonic by a nonlinear optical element, and emitted to the semiconductor film 505. An energy density may be approximately 0.01 to 100 $MW/cm^2$ (preferably 0.1 to 10 $MW/cm^2$).

It is to be noted that laser light may be emitted in an atmosphere containing an inert gas such as a rare gas or nitrogen. This makes it possible to prevent rough surface of the semiconductor due to laser light irradiation and prevent variations in threshold voltage generated due to variations in an interface state density.

Figure 4C:
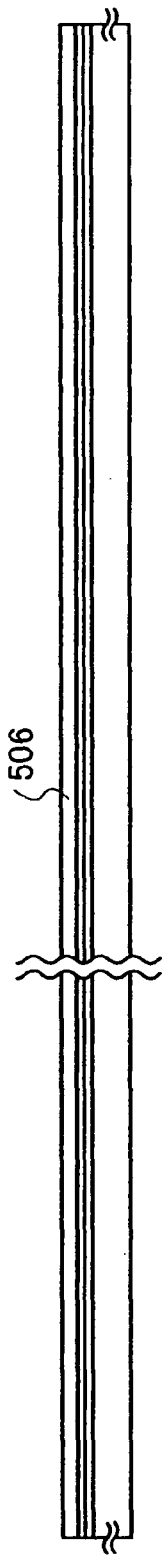

The semiconductor film 505 is irradiated with the above-described laser beam 500, so that a crystalline semiconductor film 506 with further increased crystallization is formed (see FIG. 4C).

Figure 4D:
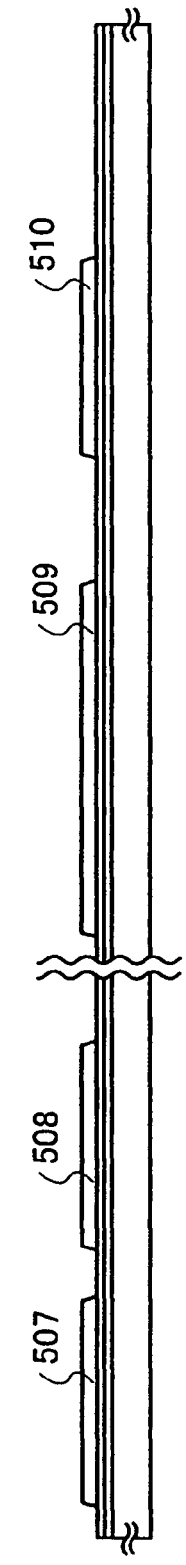

Next, as shown in FIG. 4D, island-shaped semiconductor films 507, 508, 509, and 510 are formed using the crystalline semiconductor film 506. Each of these island-shaped semiconductor films 507 to 510 becomes an active layer of a TFT that is formed in the following step.

Next, an impurity is introduced into the island-shaped semiconductor films 507 to 510 in order to control a threshold value. In this embodiment, boron (B) is introduced into each of the semiconductor films 507 to 510 by doping of diborane ($B_2H_6$).

Then, an insulating film 511 is formed so as to cover the island-shaped semiconductor films 507 to 510. For example, silicon oxide, silicon nitride, silicon oxide containing nitrogen, or the like can be used for the semiconductor film 511. A plasma CVD method, a sputtering method, or the like can be used as a formation method.

Next, after a conductive film is formed over the insulating film 511, a first conductive film 512 and a second conductive film 513 are formed. Gate electrodes 515, 516, 517, 518, and 519 are formed using these first conductive film 512 and second conductive film 513.

Each of the gate electrodes 515 to 519 is formed to have a single layer or a structure including two or more stacked layers of the conductive film. In the case where two or more layers of the conductive film are stacked, an element selected from tantalum (Ta), tungsten (W), titanium (Ti), molybdenum (Mo), and aluminum (Al), an alloy material or compound material containing the above-described element as its main component may be stacked to form the gate electrodes 515 to 519. Alternatively, the gate electrode may be formed using a semiconductor film typified by a polycrystalline silicon film doped with an impurity element such as phosphorus (P).

In this embodiment, first, a tantalum nitride (TaN) film is formed to a thickness of 10 to 50 nm, for example, 30 nm as the first conductive film 512. Then, a tungsten (W) film is formed to a thickness of 200 to 400 nm, for example, 370 nm over the first conductive film 512 as the second conductive film 513, so that a stacked film formed of the first conductive film 512 and the second conductive film 513 is formed (see FIG. 5A).

Next, anisotropic etching is continuously performed to the second conductive film and the first conductive film, and then isotropic etching is performed to the second conductive film, so that upper gate electrodes 515b, 516b, 517b, 518b, and 519b and lower gate electrodes 515a, 516a, 517a, 518a, and 519a are formed. Accordingly, the gate electrodes 515 to 519 are formed (see FIG. 5B).

The gate electrodes 515 to 519 may be used as part of a gate wiring. Alternatively, another gate wiring may be formed to connect the gate electrodes 515 to 519 to the gate wiring.

In addition, when the gate electrodes 515 to 519 are formed, part of the insulating film 511 is etched, so that a gate insulating film 514 is formed.

Then, an impurity imparting one conductivity (n type or p-type conductivity) is added to each of the island-shaped semiconductor films 507 to 510, using the gate electrodes 515 to 519 or a resist as a mask, so that a source region, a drain region, furthermore a low concentration impurity region, and the like are formed.

First, phosphorus (P) is introduced into the island-shaped semiconductor film with the use of phosphine ($PH_3$) with acceleration voltage of 60 to 120 keV and a dose amount of $1\times10^{13}$ to $1\times10^{15}$ cm$^{-2}$. When introducing the impurity, a channel formation region 525 of an n-channel TFT 542 and channel formation regions 528 and 531 of an n-channel TFT 543 are formed.

In addition, in order to manufacture p-channel TFTs 541 and 544, boron (B) is introduced into the island-shaped semiconductor film with the use of diborane ($B_2H_6$) with applied voltage of 60 to 100 keV, for example, 80 keV, and a dose amount of $1\times10^{13}$ to $5\times10^{15}$ cm$^{-2}$, for example, $3\times10^{15}$ cm$^{-2}$. Accordingly, a source region or drain region 521 of the p-channel TFT 541 and a source region or drain region 533 of the p-channel TFT 544 are formed. Also, when introducing the impurity, a channel formation region 522 of the p-channel TFT 541 and a channel formation region 534 of the p-channel TFT 544 are formed.

Furthermore, phosphorus (P) is introduced into the island-shaped semiconductor film 508 of the n-channel TFT 542 and the island-shaped semiconductor film 509 of the n-channel TFT 543 with the use of phosphine ($PH_3$) with applied voltage of 40 to 80 keV, for example, 50 keV, and a dose amount of $1.0\times10^{15}$ to $2.5\times10^{16}$ cm$^{-2}$, for example, $3.0\times10^{15}$ cm$^{-2}$. Accordingly, a low concentration impurity region 524 and a source region or drain region 523 of the n-channel TFT 542, and low concentration impurity regions 527 and 530 and source regions or drain regions 526, 529, and 532 of the n-channel TFT 543 are formed (see FIG. 5C).

In this embodiment, phosphorus (P) is contained in each of the source region or drain region 523 of the n-channel TFT 542 and the source regions or drain regions 526, 529, and 532 of the n-channel TFT 543 at concentrations of $1\times10^{19}$ to $5\times10^{21}$ cm$^{-3}$.

In addition, phosphorus (P) is contained in each of the low concentration impurity region 524 of the n-channel TFT 542 and the low concentration impurity regions 527 and 530 of the n-channel TFT 543 at concentrations of $1\times10^{18}$ to $5\times10^{19}$ cm$^{-3}$.

Moreover, boron (B) is contained in each of the source region or drain region 521 of the n-channel TFT 541 and the source region or drain region 533 of the p-channel TFT 544 at concentrations of $1\times10^{19}$ to $5\times10^{21}$ cm$^{-3}$.

Next, a first interlayer insulating film 551 is formed covering the island-shaped semiconductor films 507 to 510, the gate insulating film 514, and the gate electrodes 515 to 519.

The first interlayer insulating film 551 is formed of an insulating film containing silicon, for example, a silicon oxide film, a silicon nitride film, or a silicon oxide film containing nitrogen, or a stacked film thereof by a plasma CVD method or a sputtering method. Needless to say, the first interlayer insulating film 551 is not limited to the silicon oxide film containing nitrogen, the silicon nitride film, or the stacked film thereof, and the first interlayer insulating film 551 may be formed of a single layer or a stacked layer of another insulating film containing silicon.

In this embodiment, after the impurity is introduced, a silicon oxide film containing nitrogen is formed to a thickness of 50 nm by a plasma CVD method, and the impurity is activated by a laser irradiation method, or alternatively, the silicon oxide film containing nitrogen is formed, and the impurity is activated by heating at 550° C. in a nitrogen atmosphere for 4 hours.

Next, a silicon nitride film is formed to a thickness of 50 nm by a plasma CVD method, and a silicon oxide film containing nitrogen is further formed to a thickness of 600 nm. A stacked film formed of the silicon oxide film containing nitrogen, the silicon nitride film, and the silicon oxide film containing nitrogen is the first interlayer insulating film 551.

Next, the whole first interlayer insulating film 551 is heated at 410° C. for an hour, and hydrogen is discharged from the silicon nitride film, so that hydrogenation is performed.

Figure 6A:
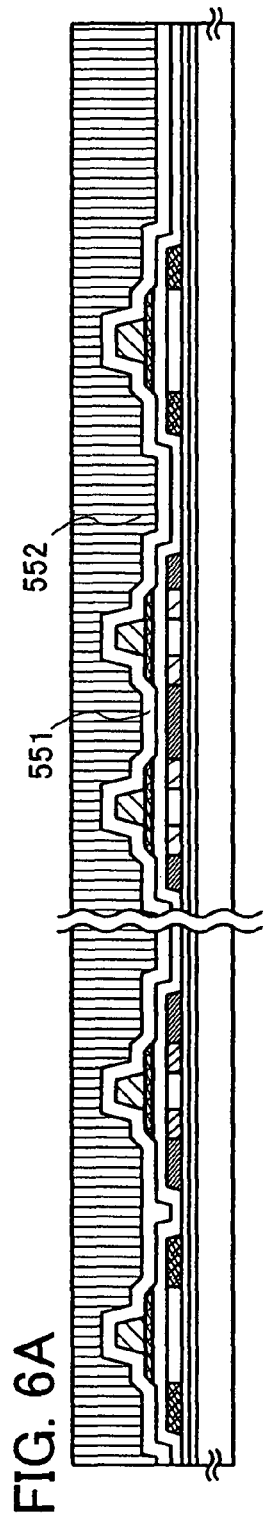
FIGS. 6A to 6C are views each illustrating a manufacturing process of a semiconductor device of the present invention.

Then, a second interlayer insulating film 552 that serves as a planarizing film is formed covering the first interlayer insulating film 551 (see FIG. 6A).

The second interlayer insulating film 552 can be formed of a photosensitive or nonphotosensitive organic material (polyimide, acrylic, polyamide, polyimide amide, a resist or benzocyclobutene), or siloxane, and a stacked layer of them. As the organic material, a positive photosensitive organic resin or a negative photosensitive organic resin can be used.

Siloxane has a skeleton structure formed by a bond of silicon (Si) and oxygen (O) and has an organic group containing at least hydrogen (for example, an alkyl group or an aryl group) as a substituent. Alternatively, as the substituent, a fluoro group may be used. Further alternatively, as the substituent, an organic group containing at least hydrogen and a fluoro group may be used.

In this embodiment, as the second interlayer insulating film 552, siloxane is formed by a spin coating method.

It is to be noted that a third interlayer insulating film may be formed over the second interlayer insulating film 552. As the third interlayer insulating film, a film which does not easily transmit moisture, oxygen, or the like in comparison with other insulating films is used. Typically, a silicon nitride film, a silicon oxide film, a silicon nitride film containing oxygen (composition ratio: N>O), a silicon oxide film containing nitrogen (composition ratio: N<O), a thin film containing carbon as its main component (for example, a diamond like carbon film (DLC film), a carbon nitride film (CN film)), or the like obtained by a sputtering method or a CVD method can be used.

Figure 6B:
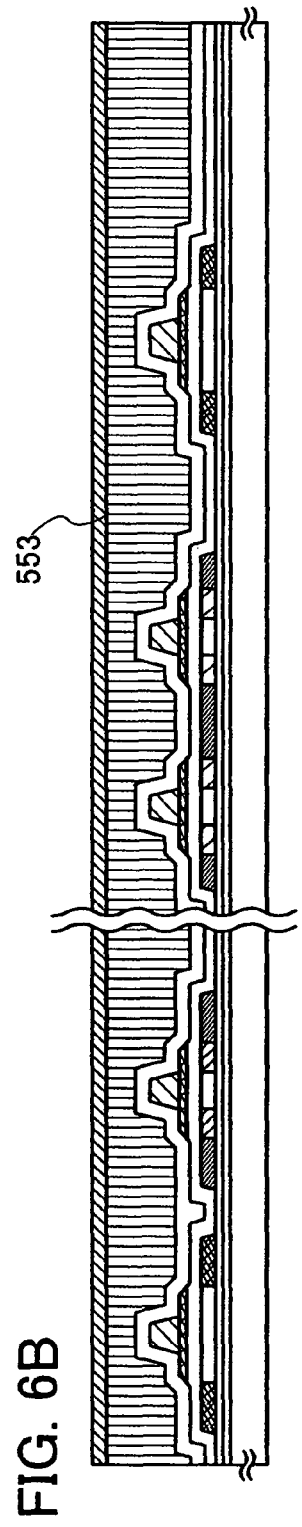

Next, a transparent conductive film 553 is formed over the second interlayer insulating film 552 (see FIG. 6B). As the transparent conductive film used in the present invention, an indium tin oxide alloy containing silicon (Si) (also referred to as indium tin oxide containing Si) is used.

Besides the indium tin oxide alloy containing Si, a transparent conductive film such as a conductive film formed using zinc oxide (ZnO), tin oxide ($SnO_2$), indium oxide, or target in which zinc oxide of 2 to 20 wt % is mixed with indium oxide may be used. In this embodiment, as the transparent conductive film 553, an indium tin oxide alloy containing Si is formed to a thickness of 110 nm by a sputtering method.

Figure 6C:
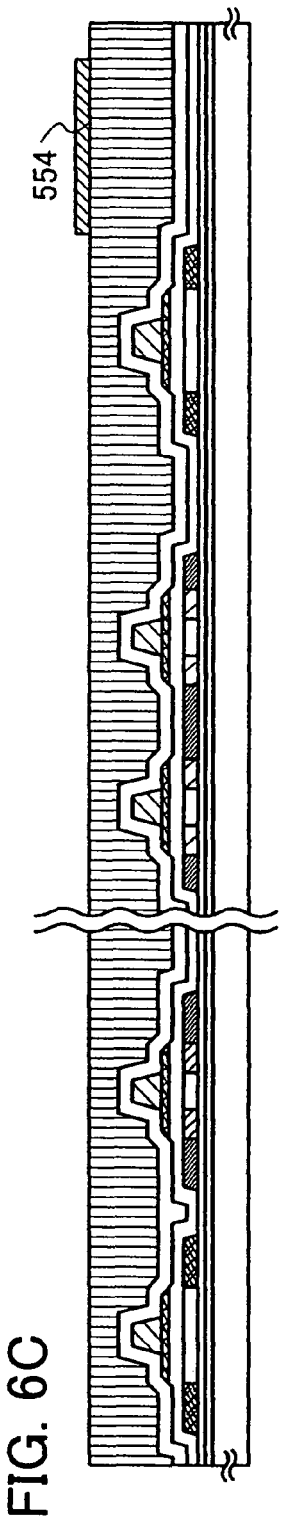

Next, a pixel electrode 554 is formed using the transparent conductive film 553 (see FIG. 6C). The transparent conductive film 553 may be etched by a wet etching method for forming the pixel electrode 554.

Figure 7A:
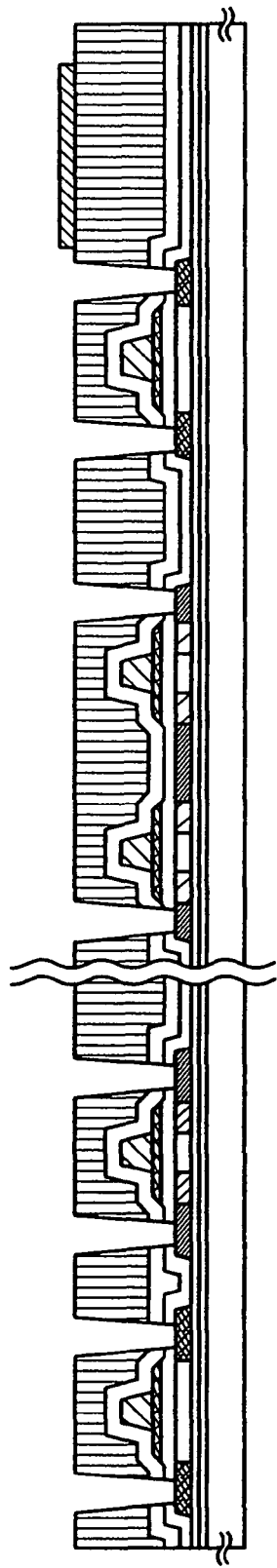
FIGS. 7A and 7B are views each illustrating a manufacturing process of a semiconductor device of the present invention.

The first interlayer insulating film 551 and the second interlayer insulating film 552 are etched, so that contact holes reaching the island-shaped semiconductor films 507 to 510 are formed in the first interlayer insulating film 551 and the second interlayer insulating film 552 (see FIG. 7A).

Figure 7B:
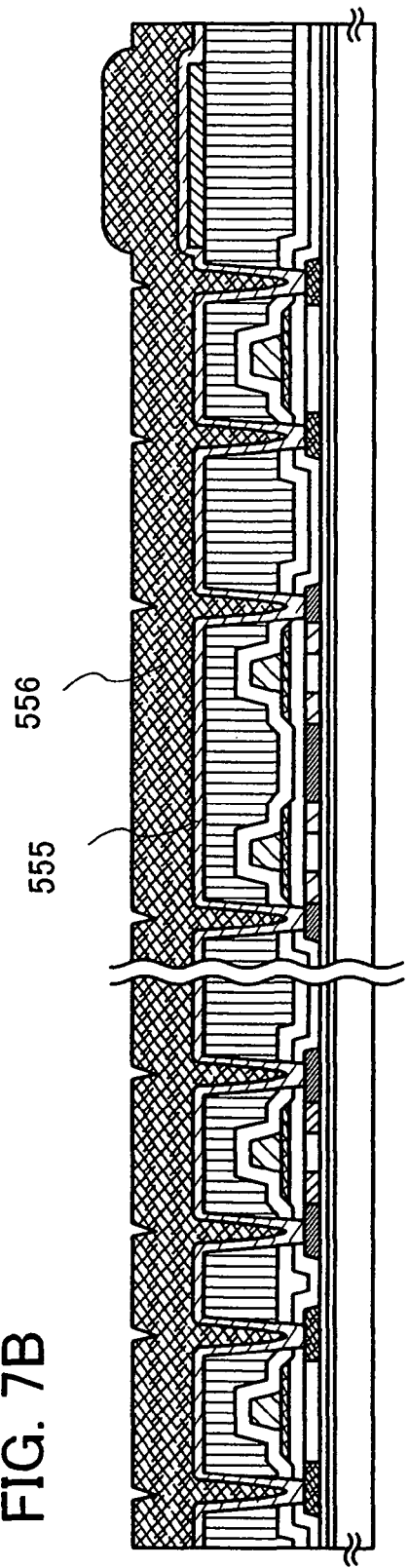

A third conductive film 555 and a fourth conductive film 556 are formed over the second interlayer insulating film 552 so as to cover the contact holes (see FIG. 7B).

In this embodiment, as the third conductive film 555, a film formed of molybdenum (Mo), tungsten (W), tantalum (Ta), or chromium (Cr), or an alloy film using the element may be used. In this embodiment, molybdenum (Mo) film is formed to a thickness of 100 nm by a sputtering method.

As the fourth conductive film 556, a film containing aluminum as its main component is formed by a sputtering method. As the film containing aluminum as its main component, an aluminum film; an aluminum alloy film containing at least one element of nickel, cobalt, and iron; or an aluminum alloy film containing carbon and at least one element of nickel, cobalt, and iron can be used. In this embodiment, an aluminum film is formed to a thickness of 700 nm by a sputtering method.

Next, the fourth conductive film 556 is etched, so that electrodes 561b, 562b, 563b, 564b, 565b, 566b, and 567b are formed (see FIG. 8A).

The fourth conductive film 556 is etched by dry etching using a mixed gas of $BCl_3$ and $Cl_2$. In this embodiment, dry etching is performed flowing $BCl_3$ and $Cl_2$ at flow rates of 60 sccm and 20 sccm, respectively.

At this time, the third conductive film 555 becomes an etching stopper, and accordingly, the pixel electrode 554 is not in contact with the mixed gas of $BCl_3$ and $Cl_2$. Therefore, generation of particles can be prevented.

Next, the third conductive film 555 is etched, so that electrodes 561a, 562a, 563a, 564a, 565a, 566a, and 567a are formed. In this embodiment, dry etching is performed to the third conductive film 555, flowing $CF_4$ and $O_2$ at flow rates of 30 to 60 sccm and 40 to 70 sccm, respectively.

At this time, since the pixel electrode 554 is not reacted with $CF_4$ and $O_2$, small particles are not formed. The pixel electrode 554 becomes an etching stopper for forming the electrode 567a by etching of the third conductive film 555.

Through the above-described steps, electrodes 561, 562, 563, 564, 565, 566, and 567 are formed. Each of the electrodes 561 to 567 may be formed of the same material and through the same step as those of a wiring, or alternatively, the electrode and the wiring may be formed separately and connected to each other.

Through the above-described sequence of steps, the n-channel TFTs 542 and 543 and the p-channel TFTs 541 and 544 are formed. The n-channel TFT 542 and the p-channel TFT 541 are connected to each other with the electrode 562, so that a CMOS circuit 571 is formed (see FIG. 8B).

Accordingly, a TFT substrate of a dual emission type display device is formed. In FIG. 8B, a driver circuit portion 595 and a pixel portion 596 are provided over the substrate 501, and the CMOS circuit 571 including the n-channel TFT 542 and the p-channel TFT 541 is formed in the driver circuit portion 595.

In the pixel portion 596, the p-channel TFT 544 serving as a pixel TFT and the n-channel TFT 543 that drives the pixel TFT are formed. In this embodiment, the pixel electrode 554 serves as an anode of a light-emitting element.

Next, by the present invention, after the electrodes 561 to 567 are formed, an insulator 581 (referred to as a partition wall, a barrier, or the like) that covers edges of the pixel electrode 554 is formed.

The insulator 581 is formed based on the description of the above-described embodiment mode. That is, the insulator 581 may be formed in such a manner that an insulating layer containing polysilane is formed, a mold is pressed against the insulating layer to form a shape, and heat treatment is performed.

After the insulator 581 is formed, an organic compound layer 582 is formed. Then, a second electrode 583, that is, a cathode of the light-emitting element is formed to a thickness of 10 to 800 nm (see FIG. 9B). As the second electrode 583, besides an indium tin oxide (ITO) alloy, a film formed using a target in which indium oxide containing a Si element is further mixed with zinc oxide (ZnO) at 2 to 20 wt % can be used, for example.

The organic compound layer 582 includes a hole injecting layer 601, a hole transporting layer 602, a light-emitting layer 603, an electron transporting layer 604, and an electron injecting layer 605 each of which is formed by an evaporation method or an application method. Further, it is preferable that vacuum heating be performed for degassing before the organic compound layer 582 is formed in order to increase reliability of the light-emitting element. For example, before an organic compound material is evaporated, heating treatment at 200 to 300° C. is desirably performed in a low-pressure atmosphere or an inert atmosphere in order to remove a gas contained in the substrate.

Next, molybdenum oxide (MoOx), 4,4'-bis[N-(1-naphthyl)-N-phenyl-amino]-biphenyl (α-NPD), and rubrene are co-evaporated selectively over the pixel electrode 554 with the use of an evaporation mask, so that the hole injecting layer 601 is formed.

Further, besides MoOx, a material with a high hole injecting property such as copper phthalocyanine (CuPc), vanadium oxide (VOx), ruthenium oxide (RuOx), or tungsten oxide (WOx) can be used. Alternatively, a film formed of a high molecular material with a high hole injecting property, such as a polyethylenedioxy thiophene solution (PEDOT) or a polystyrenesulfonic acid solution (PSS) by an application method may be used as the hole injecting layer 601.

Then, α-NPD is selectively evaporated using an evaporation mask, so that the hole transporting layer 602 is formed over the hole injecting layer 601. It is to be noted that, besides α-NPD, a material with a high hole transporting property, which is typified by an aromatic amine compound such as 4,4'-bis[N-(3-methylphenyl)-N-phenyl-amino]-biphenyl (abbreviation: TPD); 4,4',4"-tris(N,N-diphenyl-amino)-triphenylamine (abbreviation: TDATA); 4,4',4"-tris[N-(3-methylphenyl)-N-phenyl-amino]-triphenylamine (abbreviation: MTDATA) can be used.

Then, the light-emitting layer 603 is selectively formed. In order to obtain a full-color display device, alignment of an evaporation mask is performed for each light emission color (each of R, G, and B), and then evaporation is selectively performed for each light emission color.

Next, Alq$_3$ (tris-(8-quinolinolato)aluminum) is selectively evaporated using an evaporation mask, so that the electron transporting layer 604 is formed over the light-emitting layer 603. It is to be noted that, besides Alq$_3$, a material with a high electron transporting property, which is typified by a metal complex having a quinoline skeleton or a benzoquinoline skeleton such as tris(5-methyl-8-quinolinolato)aluminum (abbreviation: Almq$_3$), bis(10-hydroxybenz)[h]-quinolinato) beryllium (abbreviation: BeBq$_2$), or bis (2-methyl-8-quinolinolato)-4-phenylphenolato-aluminum (abbreviation: BAlq), or the like can be used.

Besides those, a metal complex having an oxazole-based or thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$), or the like can be used.

In addition to the metal complex, the following can be used as the electron transporting layer 604 because of a high electron transporting property: 2-(4-biphenylyl)-5-(4-tert-butylphenyl)-1,3,4-oxadiazole (abbreviation: PBD), 1,3-bis[5-(p-tert-butylphenyl)-1,3,4-oxadiazole-2-yl]benzene (abbreviation: OXD-7), 3-(4-biphenylyl)-4-phenyl-5-(4-tert-butylphenyl)-1,2,4-triazole (abbreviation: TAZ), 3-(4-biphenylyl)-5-(4-tert-butylphenyl)-4-(4-ethylphenyl)-1,2,4-triazole (abbreviation: p-EtTAZ), bathophenanthroline (abbreviation: BPhen), bathocuproin (abbreviation: BCP), or the like.

Then, 4,4-bis(5-methylbenzoxazole-2-yl)stilbene (abbreviation: BzOs) and lithium (Li) are co-evaporated, so that the electron injecting layer 605 is formed entirely covering the electron transporting layer 604 and the insulator 581. With the use of a benzoxazole derivative (BzOs), damage due to a sputtering method performed in forming the second electrode 583 in a subsequent step is suppressed.

Further, besides BzOs:Li, a material with a high electron injecting property, such as a compound of an alkali metal or an alkaline earth metal such as CaF$_2$, lithium fluoride (LiF), or cesium fluoride (CsF) can be used. Besides, a material in which Alq$_3$ and magnesium (Mg) are mixed can be used.

Next, the second electrode 583, that is, the cathode of an organic light-emitting element is formed to a thickness of 10 to 800 nm over the electron injecting layer 605. As the second electrode 583, besides an indium tin oxide (ITO) alloy, for example, a conductive film formed using a target in which zinc oxide (ZnO) is contained at 2 to 20 atomic % in indium tin oxide alloy containing Si or indium oxide can be used.

It is to be noted that, since an example of manufacturing the dual emission type display device is explained in this embodiment, the second electrode 583 is formed of an electrode with a light-transmitting property; however, in the case of manufacturing a one-side emission type display device, the second electrode 583 may be formed using a reflective conductive material. As such a conductive material, a metal, an alloy, an electronic conductive compound having a small work function (a work function of less than or equal to 3.8 eV), and a mixture of these are preferably used.

As a specific example of the material for the second electrode 583, a transition metal including a rare earth metal can be used, besides an element belonging to Group 1 or Group 2 of the periodic table, that is, an alkali metal such as Li or Cs, an alkaline earth metal such as Mg, Ca, or Sr, and an alloy containing the metal (Mg:Ag, Al:Li) or a compound containing the metal (LiF, CsF, or CaF$_2$). Alternatively, the second electrode 583 can be formed of a stacked-layer of a metal (including an alloy) such as Al or Ag.

As described above, a light-emitting element 584 is formed. A material for each of the anode 554, the organic compound layer 582, and the cathode 583 included in the light-emitting element 584 is appropriately selected and each thickness is also adjusted. It is desirable that the anode and the cathode be formed of the same material, with approximately the same thickness, preferably approximately 100 nm.

Figure 9A:
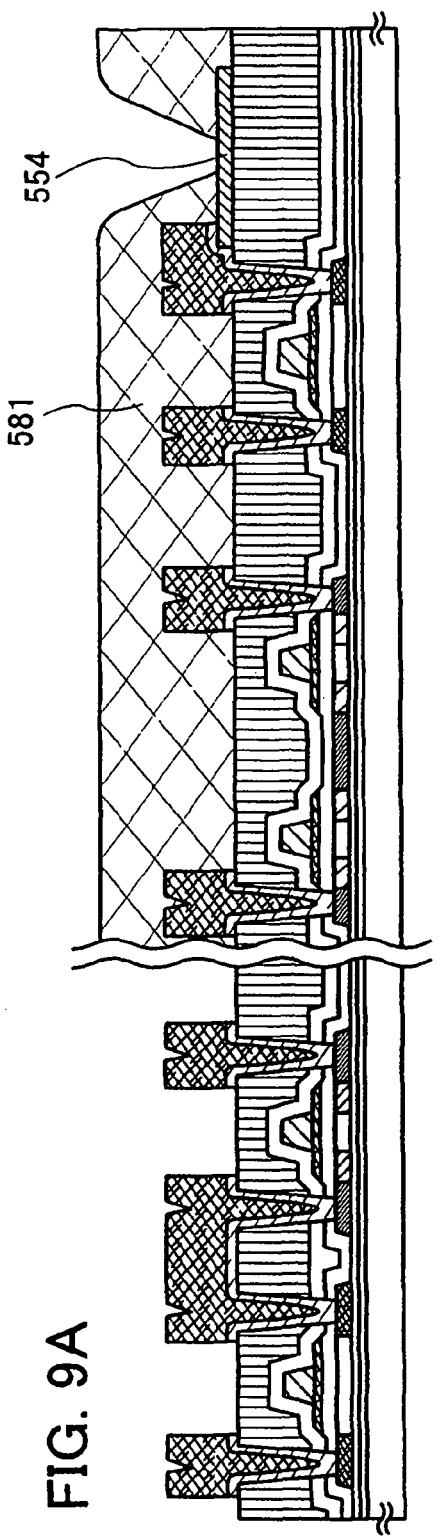
FIGS. 9A and 9B are views each illustrating a manufacturing process of a semiconductor device of the present invention.
Figure 9B:
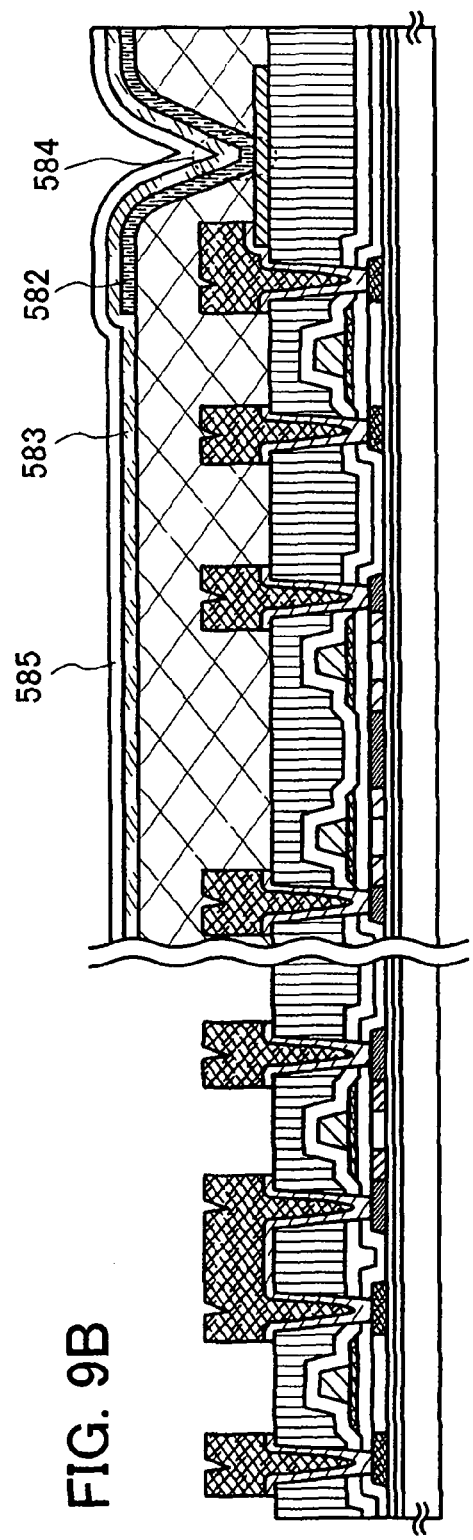
Figure 10:
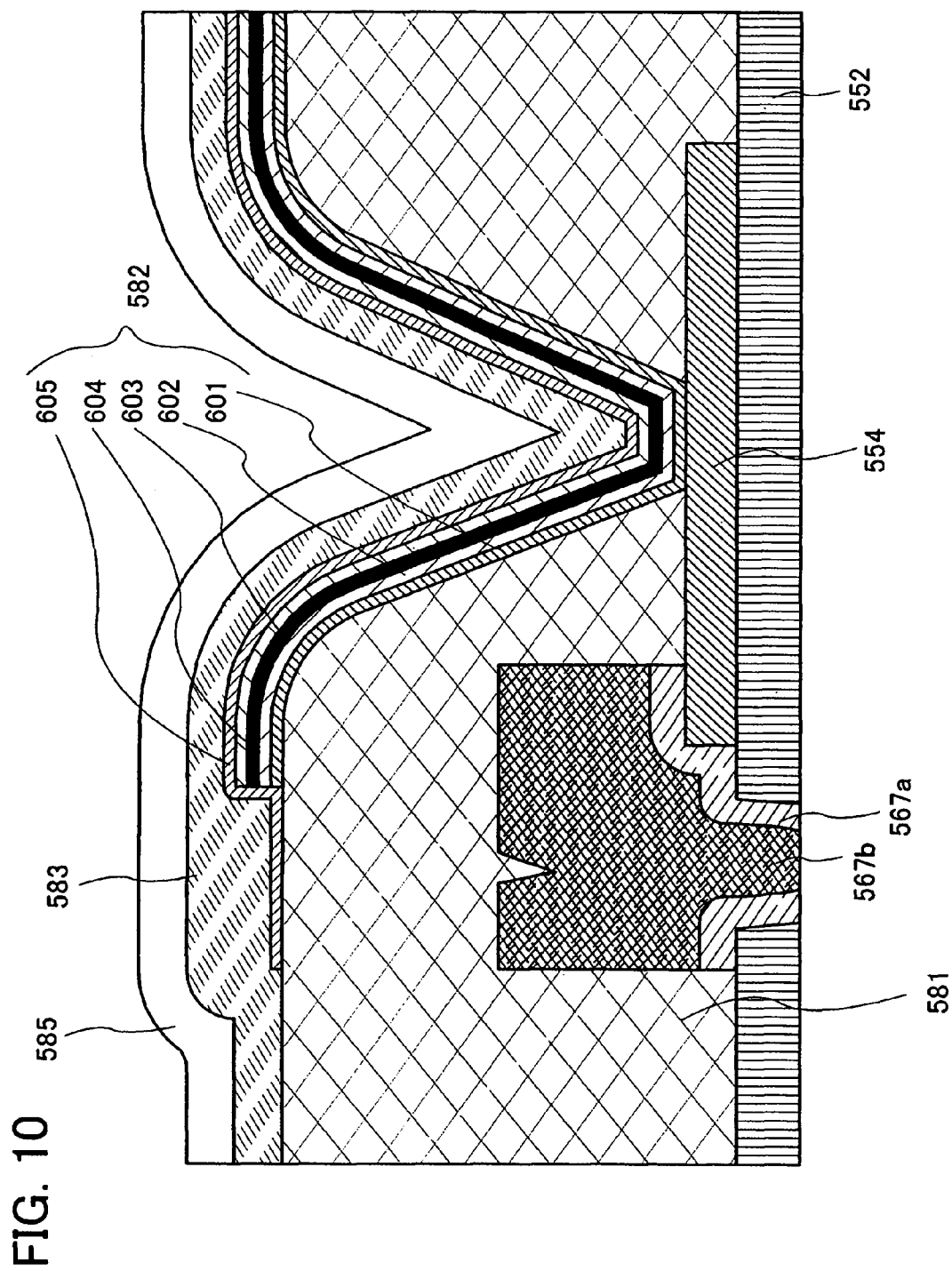
FIG. 10 is a view illustrating a manufacturing process of a semiconductor device of the present invention.

In addition, if necessary, as shown in FIG. 9B, a transparent protective layer 585 that prevents moisture from entering is formed covering the light-emitting element 584. As the transparent protective layer 585, a silicon nitride film, a silicon oxide film, a silicon nitride film containing oxygen (composition ratio: N>O), a silicon oxide film containing nitrogen (composition ratio: N<O), a thin film containing carbon as its main component (for example, a diamond like carbon film (DLC film), a carbon nitride film (CN film)), or the like obtained by a sputtering method or a CVD method can be used. It is to be noted that FIG. 10 shows an enlarged view of part of FIG. 9B.

Figure 12:
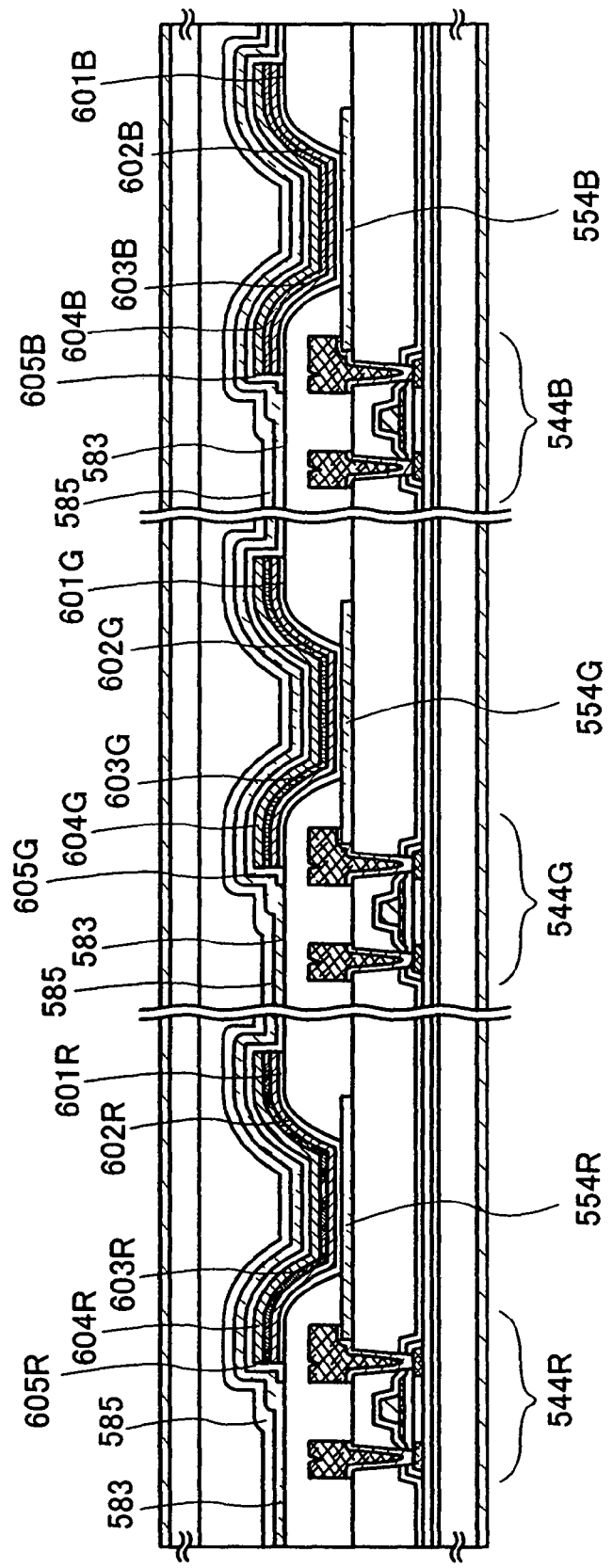
FIG. 12 is a view illustrating a manufacturing process of a semiconductor device of the present invention.

FIG. 12 shows an example in which pixel TFTs in a pixel portion are formed separately for each of R, G, and B. In a pixel for red (R), a pixel TFT 544R is connected to a pixel electrode 554R, and a hole injecting layer 601R, a hole transporting layer 602R, a light-emitting layer 603R, an electron transporting layer 604R, an electron injecting layer 605R, the cathode 583, and the transparent protective layer 585 are formed.

In a pixel for green (G), a pixel TFT 544G is connected to a pixel electrode 554C; and a hole injecting layer 601C; a hole transporting layer 602Q a light-emitting layer 603G, an electron transporting layer 604C, an electron injecting layer 605Q the cathode 583, and the transparent protective layer 585 are formed.

In a pixel for blue (B), a pixel TT 544B is connected to a pixel electrode 554B, and a hole injecting layer 601B, a hole transporting layer 602B, a light-emitting layer 603B, an electron transporting layer 604B, an electron injecting layer 605B, the cathode 583, and the transparent protective layer 585 are formed.

As the light-emitting layer 603R emitting red light, a material such as Alq$_3$:DCM1 or Alq$_3$:ruburene:BisDCJTM is used. As the light-emitting layer 603G emitting green light, a material such as Alq$_3$:DMQD (N,N'-dimethylquinacridone)

or Alq$_3$:coumarin 6 is used. As the light-emitting layer 603B emitting blue light, a material such as α-NPD or tBu-DNA is used.

Subsequently, a sealant 593 containing a gap material for securing a space between substrates is provided over the driver circuit portion 595 including the CMOS circuit 571, so that a second substrate 591 and the substrate 501 are attached to each other. The second substrate 591 may be a light-transmitting glass substrate or a quartz substrate.

It is to be noted that, in a space between the substrates 501 and 591, in a region 592 where the pixel portion 596 is provided, a drying agent may be placed as an air gap (an inert gas), or the region may be filled with a transparent sealant (such as an ultraviolet curing or a thermosetting epoxy resin).

Since the light-emitting element includes the pixel electrode 554 and the second electrode 583 each of which is formed of a light-transmitting material, light can be emitted from one light-emitting element in two directions, that is, from both the top and bottom sides.

With the above-described panel structure, light emission from a top surface can be made substantially equal to light emission from a bottom surface.

Figure 11:
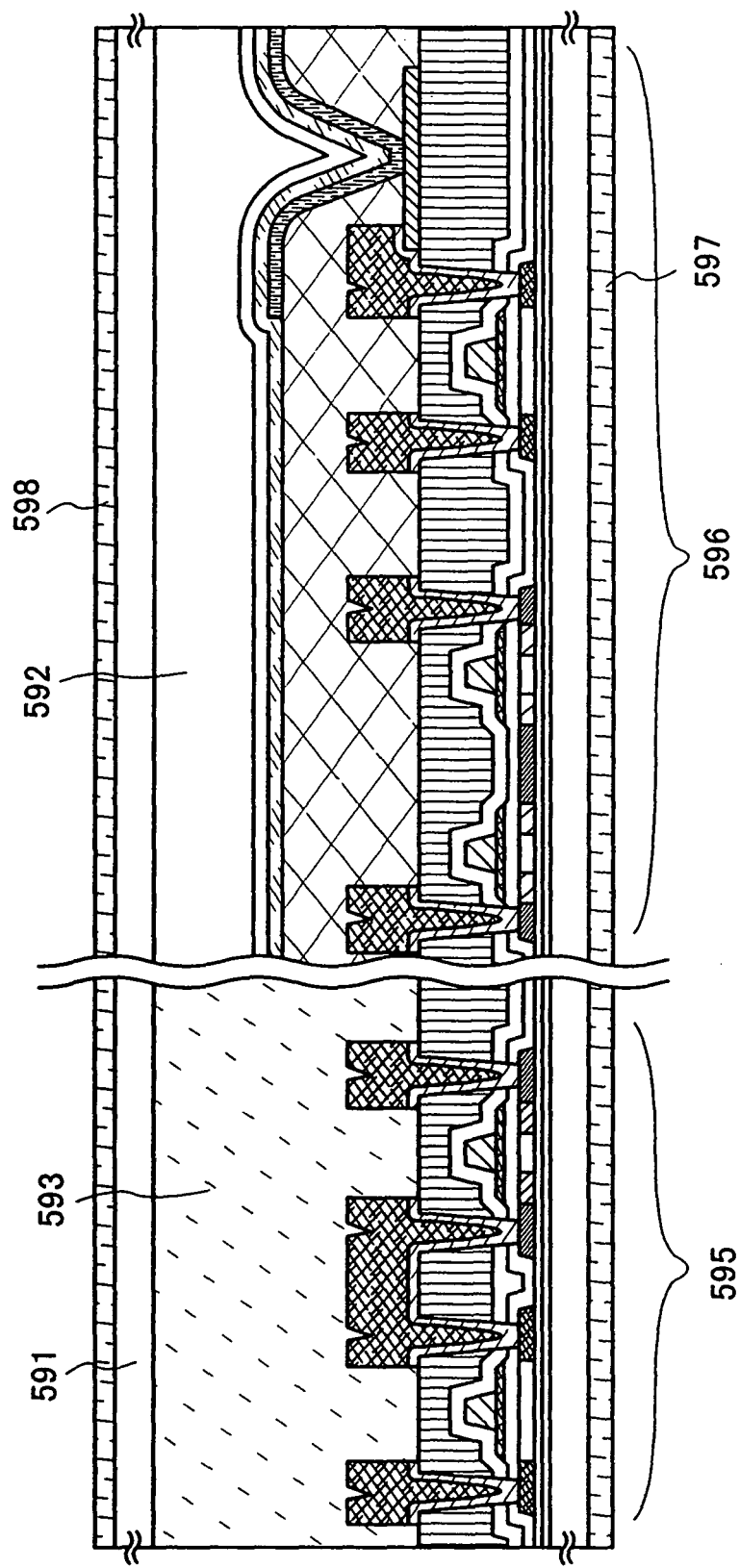
FIG. 11 is a view illustrating a manufacturing process of a semiconductor device of the present invention.

Furthermore, optical films (polarization films or circular polarization films) 597 and 598 may be provided over the substrates 501 and 591, respectively, to improve contrast (see FIG. 11).

It is to be noted that, although a top gate TFT is employed in this embodiment, the present invention is not limited to this structure, and a bottom gate (inversely staggered) TFT or a staggered TFT can be appropriately used. In addition, the present invention is not limited to a TFT with a single gate structure, and a multi gate TFT including a plurality of channel formation regions, for example, a double gate TFT may be employed.

This embodiment mode can be freely combined with Embodiment Mode and other embodiments, if necessary.

Embodiment 2

In this embodiment, an example in which the present invention is applied to an inorganic EL element will be explained with reference to FIGS. 13A to 13C and FIGS. 14A to 14C.

A light-emitting element utilizing electroluminescence is classified by whether a light-emitting material is an organic compound or an inorganic compound. In general, the former is referred to as an organic EL element and the latter is referred to as an inorganic EL element. The example in which an organic EL element is used in the present invention is described in Embodiment 1.

The inorganic EL element is classified into a dispersion type inorganic EL element and a thin film type inorganic EL element, depending on its element structure. The former and the latter are different in that the former has an electroluminescent layer in which particles of a light-emitting material are dispersed in a binder, whereas the latter has a light-emitting layer formed of a thin film of a light-emitting material. However, the former and the latter are in common in that they need an electron accelerated by a high electric field.

It is to be noted that, as a mechanism of light emission that is obtained, there are donor-acceptor recombination type light emission that utilizes a donor level and an acceptor level, and localized type light emission that utilizes inner-shell electron transition of a metal ion. In general, a dispersion type inorganic EL element exhibits donor-acceptor recombination type light emission and a thin-film type inorganic EL element exhibits localized type light emission.

A light-emitting material which can be used in the present invention includes a base material and an impurity element which becomes an emission center. By the change of the impurity element to be contained, light emission of various colors can be obtained. Various methods such as a solid-phase method or a liquid-phase method (a coprecipitation method) can be used for forming the light-emitting material. In addition, an evaporative decomposition method, a double decomposition method, a method by heat decomposition reaction of a precursor, a reversed micelle method, a method in which such a method and high temperature baking are combined, a liquid-phase method such as a freeze-drying method, or the like can be used.

A solid-phase method is a method in which a base material and an impurity element or a compound containing an impurity element are weighed, they are mixed in a mortar, the mixture is heated and baked in an electronic furnace to be reacted, so that the impurity element is contained in the base material. The baking temperature is preferably 700 to 1500° C. This is because the solid reaction does not progress when the temperature is too low, whereas the base material is decomposed when the temperature is too high. It is to be noted that, although the baking may be carried out in a powder state, it is preferable that the baking be carried out in a pellet state. Although the solid-phase method needs baking at a comparatively high temperature, the solid-phase method is easy; therefore, high productivity is obtained and the solid-phase method is suitable for mass production.

A liquid-phase method (a coprecipitation method) is a method in which a base material or a compound containing a base material and an impurity element or a compound containing an impurity element are reacted in a solution, dried, and then baked. Particles of a light-emitting material are distributed uniformly, and the reaction can progress even when the grain size is small and the baking temperature is low.

As a base material used for a light-emitting material, sulfide, oxide, or nitride can be used. As sulfide, for example, the following can be used: zinc sulfide (ZnS), cadmium sulfide (CdS), calcium sulfide (CaS), yttrium sulfide ($Y_2S_3$), gallium sulfide ($Ga_2S_3$), strontium sulfide (SrS), barium sulfide (BaS), or the like can be used. As oxide, for example, zinc oxide (ZnO), yttrium oxide ($Y_2O_3$), or the like can be used. As nitride, for example, aluminum nitride (AlN), gallium nitride (GaN), indium nitride (InN), or the like can be used.

Furthermore, as the base material used for the light-emitting material, zinc selenide (ZnSe), zinc telluride (ZnTe), or the like can also be used. Alternatively, a ternary mixed crystal such as calcium sulfide-gallium ($CaGa_2S_4$), strontium sulfide-gallium ($SrGa_2S_4$), or barium sulfide-gallium ($BaGa_2S_4$) may be used.

For an emission center of the localized type light emission, manganese (Mn), copper (Cu), samarium (Sm), terbium (Tb), erbium (Er), thulium (Tm), europium (Eu), cerium (Ce), praseodymium (Pr), or the like can be used. It is to be noted that a halogen element such as fluorine (F) or chlorine (Cl) may be added for charge compensation.

On the other hand, for an emission center of the donor-acceptor recombination type light emission, a light-emitting material containing a first impurity element which forms a donor level and a second impurity element which forms an acceptor level can be used. As the first impurity element, for example, fluorine (F), chlorine (Cl), aluminum (Al), or the like can be used. As the second impurity element, for example, copper (Cu), silver (Ag), or the like can be used.

In the case where the light-emitting material for the donor-acceptor recombination type light emission is synthesized by a solid-phase method, each of a base material, a first impurity element or a compound containing a first impurity element, and a second impurity element or a compound containing a second impurity element is weighed and mixed in a mortar, and then heated and baked in an electronic furnace.

The above-described base material can be used for the base material. As the first impurity element or the compound containing the first impurity element, for example, fluorine (F), chlorine (Cl), aluminum sulfide ($Al_2S_3$), or the like can be used. As the second impurity element or the compound containing the second impurity element, for example, copper (Cu), silver (Ag), copper sulfide ($Cu_2S$), silver sulfide ($Ag_2S$), or the like can be used.

The baking temperature is preferably 700 to 1500° C. This is because the solid reaction does not progress when the temperature is too low, whereas the base material is decomposed when the temperature is too high. It is to be noted that, although the baking may be carried out in a powder state, it is preferable that the baking be carried out in a pellet state.

As an impurity element in the case of utilizing solid-phase reaction, a compound containing a first impurity element and a second impurity element may be used. In this case, the impurity element is easily diffused and solid-phase reaction easily progresses; thus, a uniform light-emitting material can be obtained. Moreover, since an unnecessary impurity element does not enter, a light-emitting material with high purity can be obtained. As the compound containing the first impurity element and the second impurity element, for example, copper chloride (CuCl), silver chloride (AgCl), or the like can be used.

It is to be noted that these impurity elements may be contained in the base material at concentrations of 0.01 to 10 atom %, preferably, 0.05 to 5 atom %.

In the case of the thin-film type inorganic EL element, an electroluminescent layer, which contains the above-described light-emitting material, can be formed by a vacuum evaporation method such as a resistance heating evaporation method or an electron beam evaporation (EB evaporation) method; a physical vapor deposition method (PVD) such as a sputtering method; a chemical vapor deposition method (CVD) such as a metal organic CVD method or a low-pressure hydride transport CVD method; an atomic layer epitaxy method (ALE); or the like.

Figure 13A:
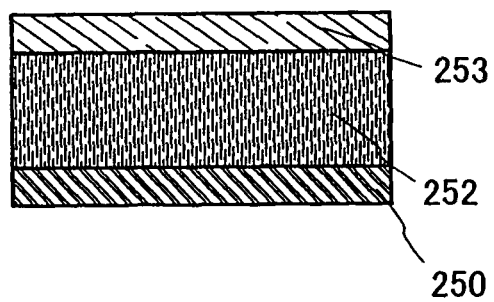
FIGS. 13A to 13C are views each illustrating a manufacturing process of a semiconductor device of the present invention.
Figure 13B:
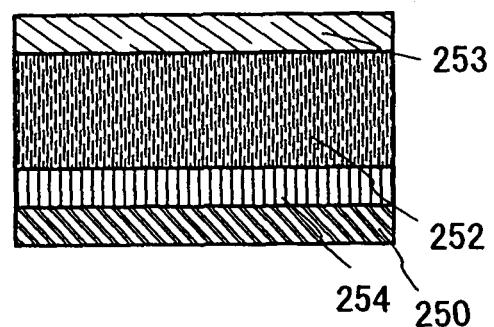
Figure 13C:
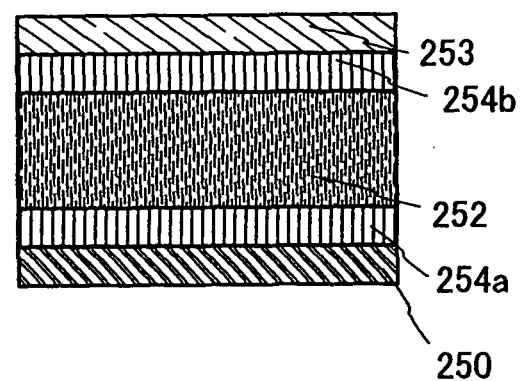

An example of a thin-film type inorganic EL element that can be used as a light-emitting element is shown in FIGS. 13A to 13C. In FIGS. 13A to 13C, the light-emitting element includes a first electrode layer 250, an electroluminescent layer 252, and a second electrode layer 253.

In order to manufacture a light-emitting device using the light-emitting element shown in FIGS. 13A to 13C, in the light-emitting device shown in FIG. 11 that is described in Embodiment 1, the light-emitting elements in FIGS. 13A to 13C may be replaced with the light-emitting element 584 in FIG. 11.

Each of the light-emitting elements shown in FIGS. 13B and 13C has a structure in which an insulating layer is provided between an electrode layer and an electroluminescent layer in the light-emitting element shown in FIG. 13A. The light-emitting element shown in FIG. 13B has an insulating layer 254 between the first electrode layer 250 and the electroluminescent layer 252. The light-emitting element shown in FIG. 13C has an insulating layer 254a between the first electrode layer 250 and the electroluminescent layer 252, and has an insulating layer 254b between the second electrode layer 253 and the electroluminescent layer 252. As described above, an insulating layer may be provided between an electroluminescent layer and one of a pair of electrode layers that sandwich the electroluminescent layer. Alternatively, an insulating layer may be provided between an electroluminescent layer and one of a pair of electrode layers that sandwich the electroluminescent layer and another insulating layer between the electroluminescent layer and the other one of the pair of electrode layers. Also, an insulating layer may be a single layer or a stacked layer including a plurality of layers.

In addition, although the insulating layer 254 is provided so as to be in contact with the first electrode layer 250 in FIG. 13B, the order of the insulating layer and the electroluminescent layer may be reversed so that the insulating layer 254 is provided to be in contact with the second electrode layer 253.

In the case of the dispersion type inorganic EL element, particulate light-emitting materials are dispersed in a binder, so that a film electroluminescent layer is formed. When particles having a desired size cannot be sufficiently obtained by a method for forming a light-emitting material, the light-emitting materials may be processed into particles by crushing in a mortar or the like. The binder is a substance for fixing the particulate light-emitting materials in a dispersion state and holding the light-emitting materials in a form of an electroluminescent layer. The light-emitting materials are uniformly dispersed in the electroluminescent layer by the binder and are fixed.

In the case of the dispersion type inorganic EL element, as a formation method of an electroluminescent layer, a droplet discharging method capable of selectively forming an electroluminescent layer; a printing method (such as screen printing or offset printing); or a coating method such as a spin coating method; a dipping method; a dispenser method; or the like can be used. Although there is no particular limitation on a thickness of the electroluminescent layer, the thickness thereof is preferably in a range of 10 to 1000 nm. The ratio of the light-emitting material in the electroluminescent layer containing the light-emitting material and the binder may be greater than or equal to 50 wt % and less than or equal to 80 wt %.

Figure 14A:
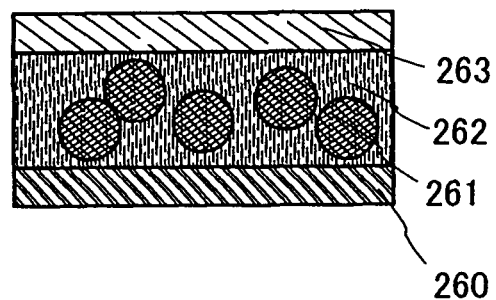
FIGS. 14A to 14C are views each illustrating a manufacturing process of a semiconductor device of the present invention.
Figure 14B:
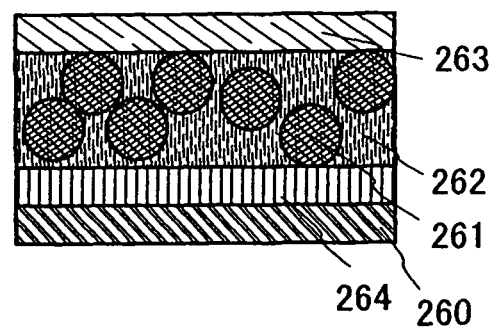
Figure 14C:
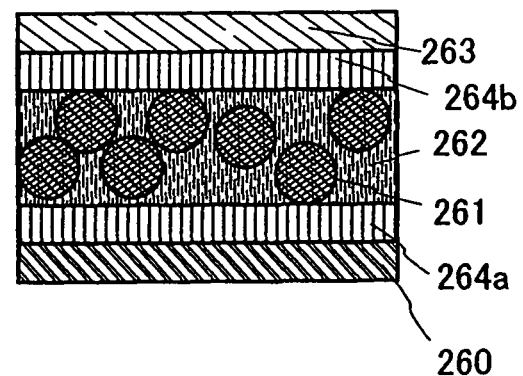

An example of the dispersion type inorganic EL element that can be used as a light-emitting element is shown in FIGS. 14A to 14C. A light-emitting element shown in FIG. 14A has a structure in which a first electrode layer 260, an electroluminescent layer 262, and a second electrode layer 263 are stacked and light-emitting materials 261 held by a binder is contained in the electroluminescent layer 262.

In order to manufacture a light-emitting device using the light-emitting element shown in FIGS. 14A to 14C, in the light-emitting device shown in FIG. 11 that is described in Embodiment 1, the light-emitting elements in FIGS. 14A to 14C may be replaced with the light-emitting element 584 in FIG. 11.

As a binder that can be used in this embodiment, an insulating material can be used, and an organic material or an inorganic material can be used, or a mixed material of an organic material and an inorganic material may be used. As an organic insulating material, polymer which has comparatively high dielectric constant like cyanoethyl cellulose-based resin; or a resin such as polyethylene, polypropylene, a polystyrene-based resin, a silicone resin, an epoxy resin, or vinylidene fluoride can be used. Alternatively, a heat-resistant polymer such as aromatic polyamide or polybenzoimidazole, or a siloxane resin may be used.

Siloxane has a skeleton structure formed by a bond of silicon (Si) and oxygen (O) and has an organic group containing at least hydrogen (for example, an alkyl group or an aryl group) as a substituent. Alternatively, as the substituent, a fluoro group may be used. Further alternatively, as the substituent, an organic group containing at least hydrogen and a fluoro group may be used.

A resin material such as a vinyl resin such as polyvinyl alcohol or polyvinyl butyral, a phenol resin, a novolac resin, an acrylic resin, a melamine resin, a urethane resin, an oxazole resin (polybenzoxazole) may also be used as the organic material as well as the above-described materials. A dielectric constant can also be controlled by mixing these resins with microparticles having a high dielectric constant such as barium titanate ($BaTiO_3$) or strontium titanate ($SrTiO_3$) as appropriate.

As the inorganic material contained in the binder, the following can be used: a material selected from silicon oxide (SiOx), silicon nitride (SiNx), silicon containing oxygen and nitrogen, aluminum nitride (AlN), aluminum containing oxygen and nitrogen or aluminum oxide ($Al_2O_3$), titanium oxide ($TiO_2$), $BaTiO_3$, $SrTiO_3$, lead titanate ($PbTiO_3$), potassium niobate ($KNbO_3$), lead niobate ($PbNbO_3$), tantalum oxide $Ta_2O_5$), barium tantalate ($BaTa_2O_6$), lithium tantalate ($LiTaO_3$), yttrium oxide ($Y_2O_3$), zirconium oxide ($ZrO_2$), ZnS, and other substances containing an inorganic material. When an inorganic material having high dielectric constant is mixed with an organic material (by addition or the like), dielectric constant of an electroluminescent layer including a light-emitting material and a binder can be further controlled and increased.

In a manufacturing process, the light-emitting materials are dispersed in a solution containing a binder. As a solvent of the solution containing a binder that can be used in this embodiment, it is preferable that a solvent that dissolves a binder material and that can make a solution with the viscosity of which is appropriate for a method of forming an electroluminescent layer (various wet processes) and a desired thickness. When an organic solvent or the like can be used, and for example, when a siloxane resin is used as the binder, propylene glycolmonomethyl ether, propylene glycolmonomethyl ether acetate (also referred to as PGMEA), 3-methoxy-3-methyl-1-butanol (also referred to as MMB), or the like can be used.

Each of the light-emitting elements shown in FIGS. 14B and 14C has a structure in which an insulating layer is provided between an electrode layer and an electroluminescent layer in the light-emitting element shown in FIG. 14A. The light-emitting element shown in FIG. 14B has an insulating layer 264 between the first electrode layer 260 and the electroluminescent layer 262. The light-emitting element shown in FIG. 14C has an insulating layer 264a between the first electrode layer 260 and the electroluminescent layer 262, and has an insulating layer 264b between the second electrode layer 263 and the electroluminescent layer 262. As described above, an insulating layer may be provided between an electroluminescent layer and one of a pair of electrode layers that sandwich the electroluminescent layer. Alternatively, an insulating layer may be provided between an electroluminescent layer and one of a pair of electrode layers that sandwich the electroluminescent layer and another insulating layer between the electroluminescent layer and the other one of the pair of electrode layers. Also, an insulating layer may be a single layer or a stacked layer including a plurality of layers.

In addition, although the insulating layer 264 is provided so as to be in contact with the first electrode layer 260 in FIG. 14B, the order of the insulating layer and the electroluminescent layer may be reversed so that the insulating layer 264 is provided to be in contact with the second electrode layer 263.

An insulating layer such as the insulating layer 254 in FIGS. 13A to 13C and the insulating layer 264 in FIGS. 14A to 14C are not particularly limited; however, it is preferable that the insulating layer have high withstand voltage, be a dense film, and furthermore have high dielectric constant.

For example, the insulating layer can be formed using silicon oxide ($SiO_2$), yttrium oxide ($Y_2O_3$), titanium oxide ($TiO_2$), aluminum oxide ($Al_2O_3$), hafnium oxide ($HfO_2$), tantalum oxide ($Ta_2O_5$), barium titanate ($BaTiO_3$), strontium titanate ($SrTiO_3$), lead titanate ($PbTiO_3$), silicon nitride ($Si_3N_4$), zirconium oxide ($ZrO_2$), or the like; a mixed film thereof; or a stacked film containing two or more kinds of the elements.

These insulating layers can be formed by sputtering, evaporation, CVD, or the like. Alternatively, the insulating layer may be formed in such a manner that particles of these insulting materials are dispersed in a binder. A binder material may be formed of a material that is similar to that of a binder contained in an electroluminescent layer and by a method that is similar thereto. Although there is no particular limitation on the thickness of the insulating layer, the thickness thereof is preferably in a range of 10 to 1000 nm.

Although the light-emitting element described in this embodiment emits light by application of voltage between the pair of electrode layers that sandwich the electroluminescent layer, the light-emitting element can also be operated by either DC drive or AC drive.

This embodiment can be freely combined with Embodiment Mode and other embodiments, if necessary.

Embodiment 3

As electronic appliances to which the present invention is applied, the following can be given: a camera such as a video camera or a digital camera; a goggle type display, a navigation system; an audio reproducing device (such as a car audio component set); a computer; a game machine; a portable information terminal (such as a mobile computer, a cellular phone, a portable game machine, or an e-book reader); an image reproducing device provided with a storage medium (specifically, a device for reproducing a storage medium such as a digital versatile disc (DVD) and having a display for displaying the reproduced image), and the like.

Specific examples of the electronic appliances are shown in FIG. 15, FIG. 16, FIGS. 17A and 17B, FIG. 18, FIG. 19, FIG. 20, and FIGS. 21A to 21E.

Figure 15:
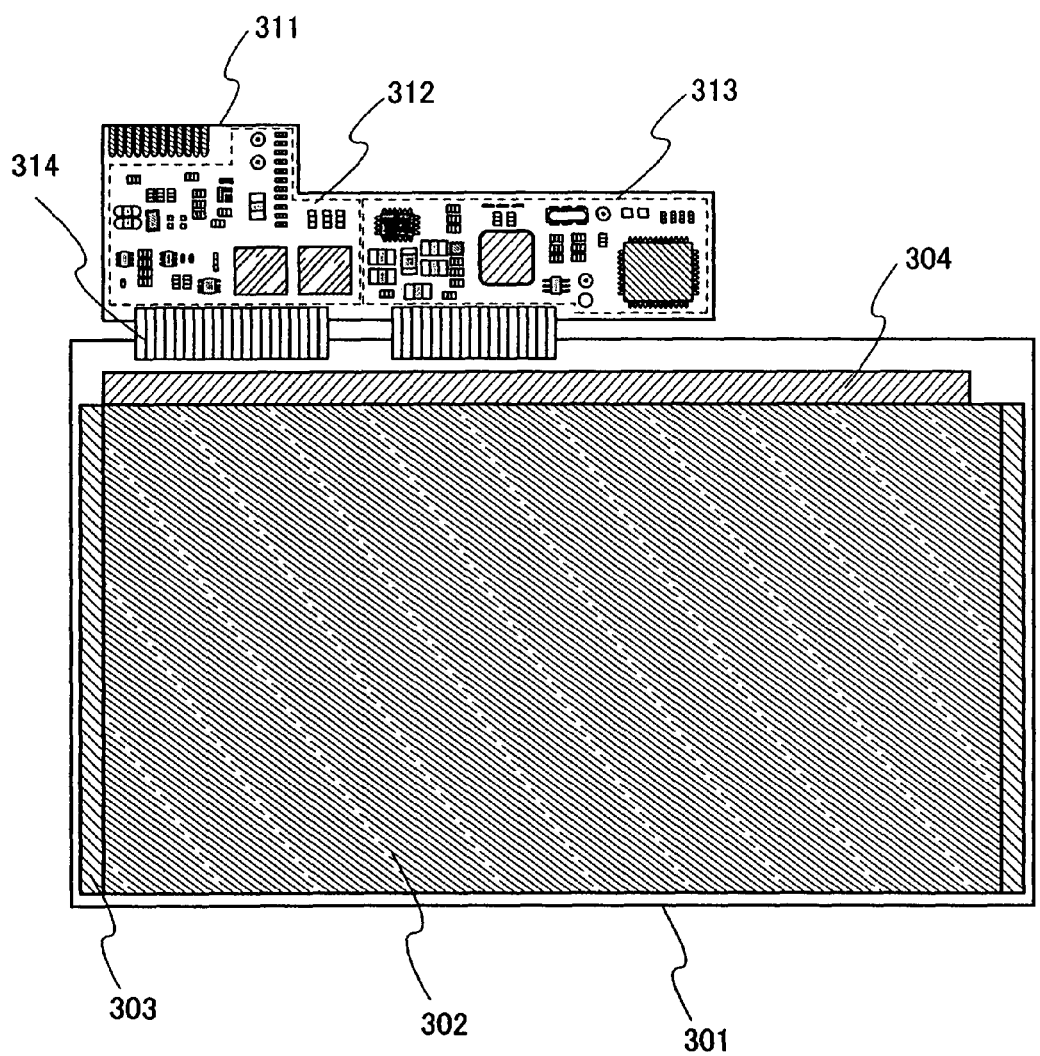
FIG. 15 is a view illustrating an EL module of the present invention.

FIG. 15 shows an EL module in which a display panel 301 and a circuit substrate 311 are combined. In the circuit substrate 311, a control circuit 312, a signal division circuit 313, and the like are formed. The circuit substrate 311 is electrically connected to the display panel 301 via a connection wiring 314.

This display panel 301 includes a pixel portion 302 provided with a plurality of pixels, a scanning line driver circuit 303, and a signal line driver circuit 304 that supplies a video signal to a selected pixel. The display panel 301 of the EL module may be manufactured by the method for manufacturing the display device described in Embodiment 1 or 2.

Figure 16:
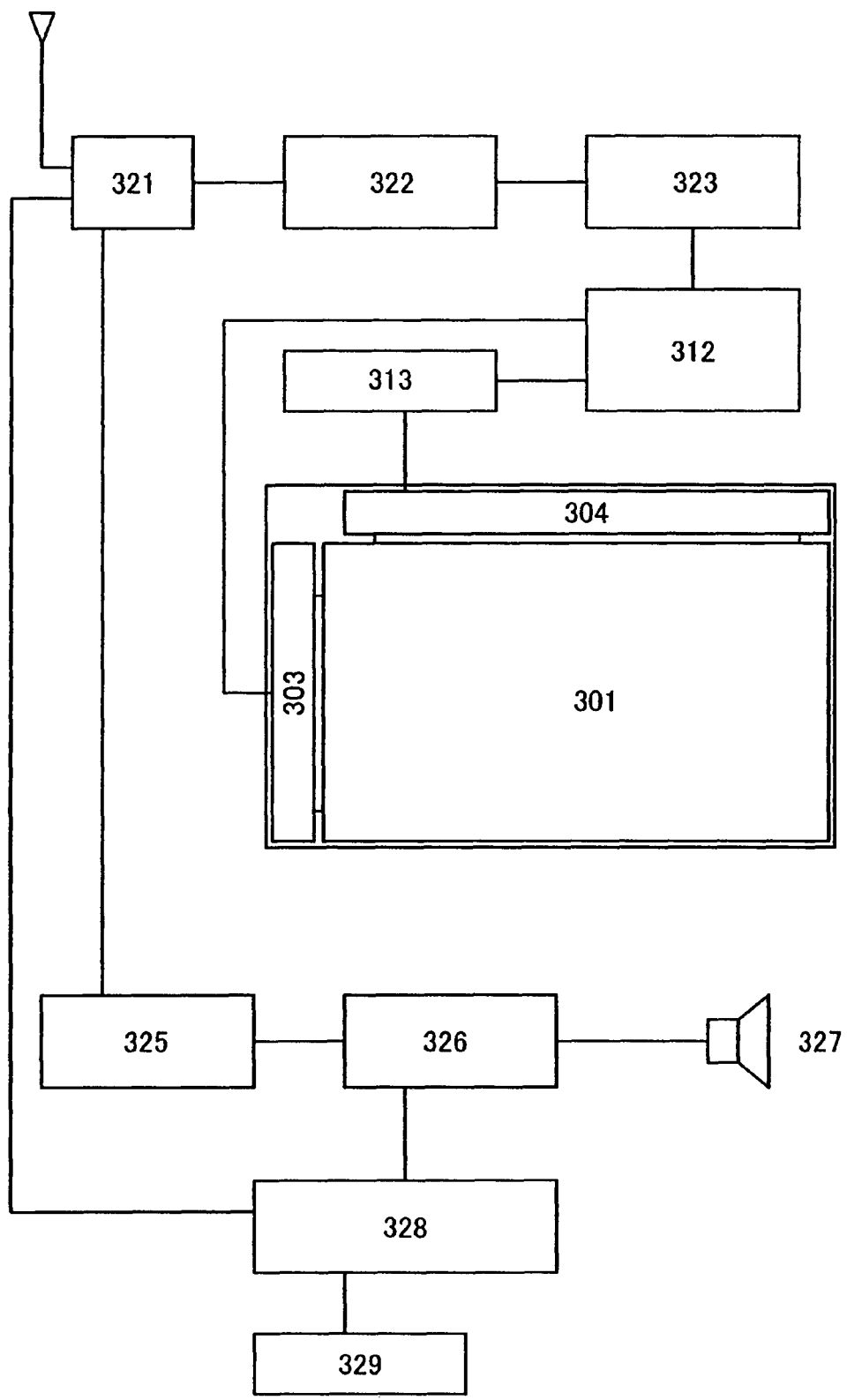
FIG. 16 is a block diagram illustrating a structure of a receiver of the present invention.

A television receiver can be completed by the EL module shown in FIG. 15. FIG. 16 is a block diagram that shows a main structure of the receiver. A tuner 321 receives a video signal and an audio signal. The video signal is processed by a video signal amplifier circuit 322, a video signal processing circuit 323 that converts a signal output from the video signal amplifier circuit 322 into a color signal corresponding to each color of red, green, and blue, and the control circuit 312 for converting the video signal into input specification of a driver IC. The control circuit 312 outputs a signal to the scanning line side and the signal line side. In the case of digital driving, the signal division circuit 313 is provided on the signal line side and an input digital signal may be divided into m pieces to be supplied.

Of signals received by the tuner 321, an audio signal is sent to an audio signal amplifier circuit 325 and an output thereof is supplied to a speaker 327 through an audio signal processing circuit 326. A control circuit 328 receives control information of a receiving station (reception frequency) or sound volume from an input portion 329 and sends a signal to the tuner 321 or the audio signal processing circuit 326.

Figure 17A:
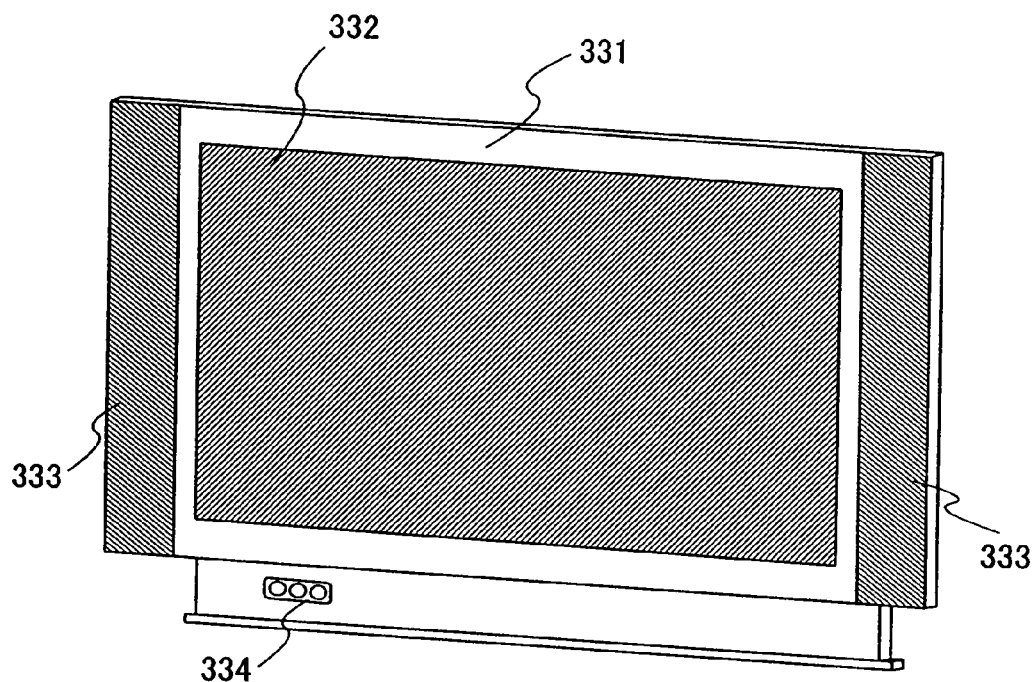
FIGS. 17A and 17B are views each illustrating an example of an electronic appliance to which the present invention is applied.

As shown in FIG. 17A, the EL module is incorporated into a chassis 331, whereby a television receiver can be completed. A display screen 332 is formed by the EL module. In addition, speakers 333, operation switches 334, and the like are appropriately provided.

Figure 17B:
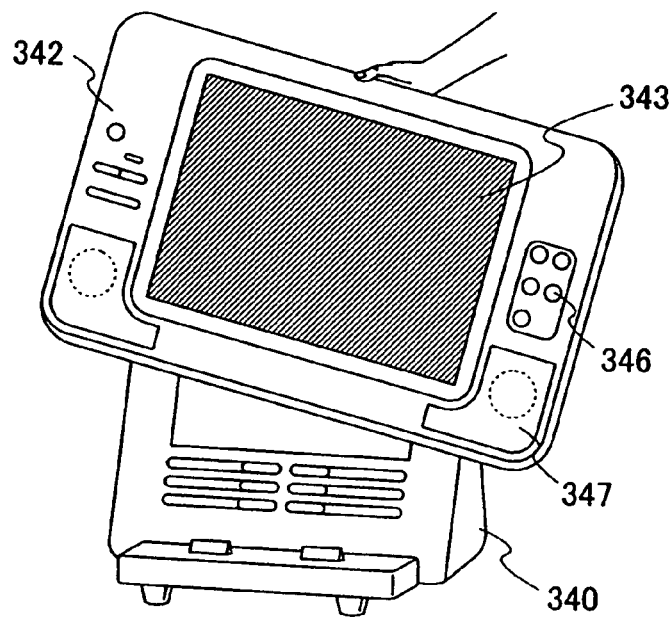

FIG. 17B shows a portable television receiver of which a display is portable wirelessly. A battery and a signal receiver are incorporated into a chassis 342, and a display portion 342 and a speaker portion 347 are driven by the battery. The battery can be charged repeatedly with a battery charger 340. In addition, the battery charger 340 can send and receive a video signal and can send the video signal to a signal receiver of the display. The chassis 342 is controlled by operation keys 346.

In addition, the device shown in FIG. 17B can also be referred to as a two-way video/audio communication device since the device can send a signal from the chassis 342 to the battery charger 340 by operation of the operation keys 346. Moreover, by operation of the operation keys 346, a signal can be sent from the chassis 342 to the battery charger 340 and the signal can be further sent from the battery charger 340 to another electronic appliance, so that communication control of the another electronic appliance is also possible. Therefore, the device is also referred to as a general-purpose remote control device. The present invention can be applied to the display portion 343.

When the present invention is used for the television receivers shown in FIG. 15, FIG. 16, and FIGS. 17A and 17B, a television receiver having a highly durable display device in which decreasing rate of luminance is slow can be obtained.

Needless to say, the present invention is not limited to a television receiver, and can be applied to various applications, in particular, as a large-area display medium for example, an information display board at the train station or airport, an advertising display board on the street and the like, in addition to a monitor of a personal computer.

Figure 18:
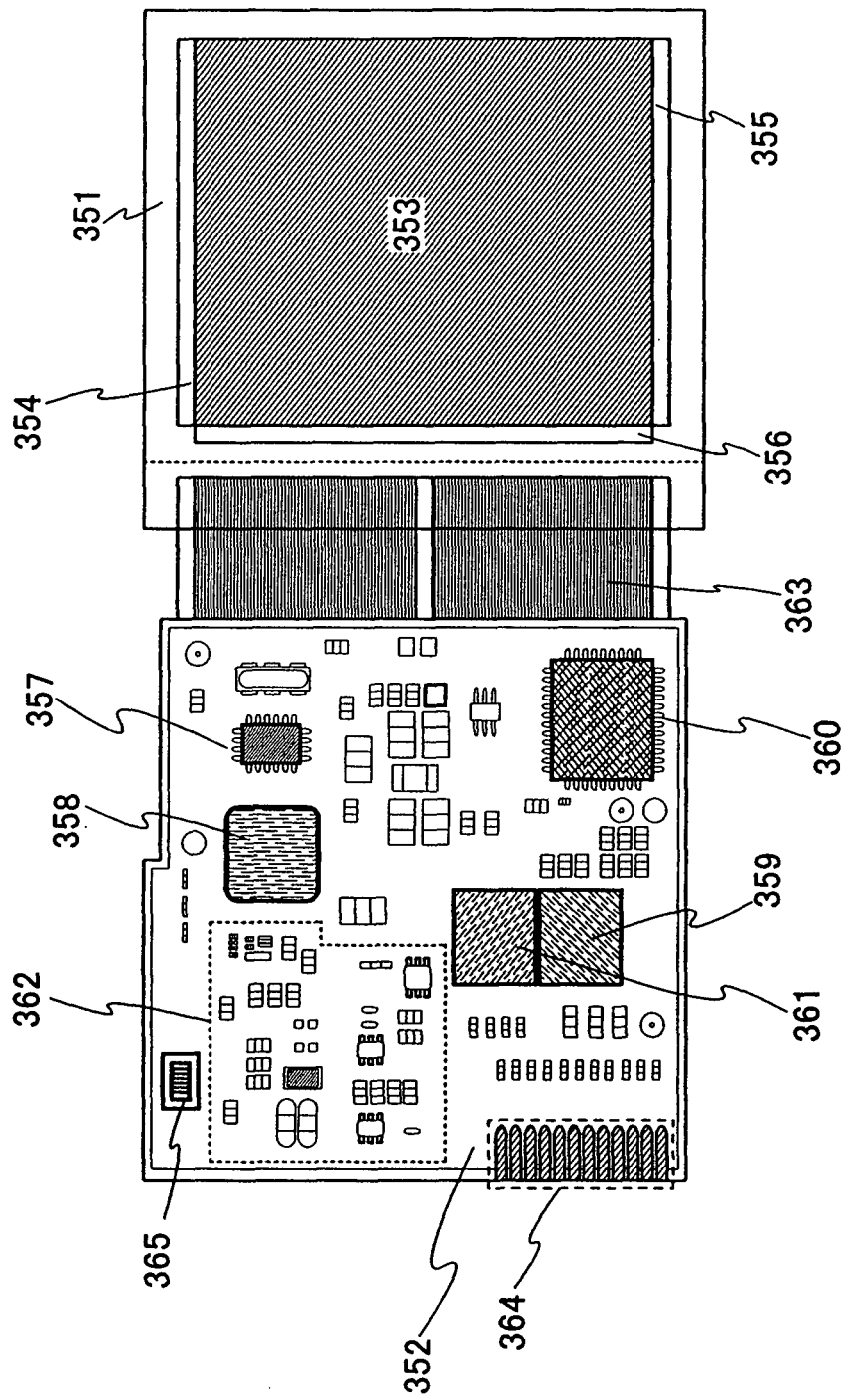
FIG. 18 is a view illustrating a module of the present invention.
Figure 19:
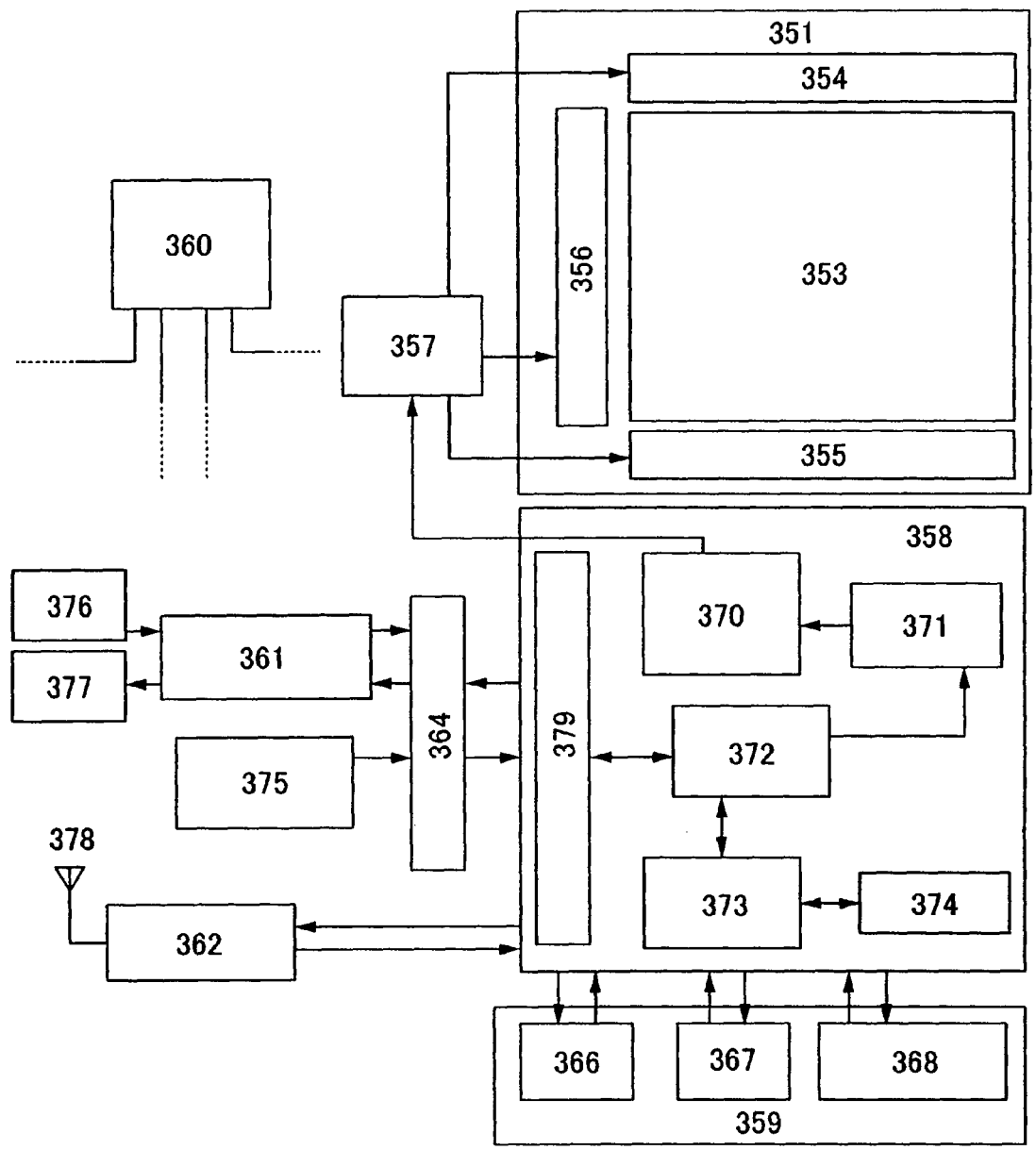
FIG. 19 is a view illustrating a module of the present invention.

Each of FIG. 18 and FIG. 19 shows a module in which a display panel 351 and a printed circuit board 352 are combined. The display panel 351 includes a pixel portion 353 provided with a plurality of pixels, a first scanning line driver circuit 354, a second scanning line driver circuit 355, and a signal line driver circuit 356 that supplies a video signal to a selected pixel.

The printed circuit board 352 is provided with a controller 357, a central processing unit (CPU) 358, memory 359, a power supply circuit 360, an audio processing circuit 361, a sending-receiving circuit 362, and the like. The printed circuit board 352 and the display panel 351 are connected to each other by a flexible printed circuit (FPC) board 363. The printed circuit board 352 may be provided with a capacitor, a buffer circuit, or the like so that noise on a power supply voltage or a signal and delay in signal rising are prevented. In addition, the controller 357, the audio processing circuit 361, the memory 359, the CPU 358, the power supply circuit 360, or the like can be mounted on the display panel 351 by a COG (Chip On Glass) method. The COG method allows the size of the printed circuit board 352 to be reduced.

Various control signals are input and output through an interface 364 provided for the printed circuit board 352. In addition, an antenna port 365 for sending and receiving signals to and from an antenna is provided for the printed circuit board 352.

FIG. 19 is a block diagram of the module shown in FIG. 17. This module includes VRAM 366, DRAM 367, flash memory 368, or the like as memory 359. Data of an image to be displayed on the panel, image data or audio data, and various programs are stored in the VRAM 366, the DRAM 367, and the flash memory respectively.

The power supply circuit 360 supplies power for operating the display panel 351, the controller 357, the CPU 358, the audio processing circuit 361, the memory 359, and the transmitting-receiving circuit 362. In addition, depending on the panel specifications, the power supply circuit 360 is provided with a current source.

The CPU 358 includes a control signal generating circuit 370, a decoder 371, a register 372, an arithmetic circuit 373, RAM 374, an interface 379 for the CPU 358, and the like. Various signals input into the CPU 358 through the interface 379 are once held in the register 372, and then input into the arithmetic circuit 373, the decoder 371, or the like. In the arithmetic circuit 373, operation is performed based on the input signals, and locations to which various instructions are sent are specified. On the other hand, the signal input into the decoder 371 is decoded and input into the control signal generating circuit 370. Based on the input signal, the control signal generating circuit 370 generates signals including various instructions, and sends the signals to the locations specified by the arithmetic circuit 373, specifically, the memory 359, the sending-receiving circuit 362, the audio processing circuit 361, the controller 357, or the like.

Each of the memory 359, the sending/receiving circuit 362, the audio processing circuit 361, and the controller 357 operates in accordance with the received instruction. The operations are briefly explained below.

A signal input from an input unit 375 is sent through the interface 364 to the CPU 358 mounted on the printed circuit board 352. The control signal generating circuit 370 converts image data stored in the VRAM 366 into a predetermined format in accordance with the signal sent from the input unit 375 such as a pointing device or a keyboard, and sends it to the controller 357.

The controller 357 performs data processing to the signal including the image data sent from the CPU 358 in accordance with the panel specifications, and supplies it to the display panel 351. In addition, based on a power supply voltage input from the power supply circuit 360 and various signals input from the CPU 358, the controller 357 generates a Hsync signal, a Vsync signal, a clock signal CLK, an alternating voltage (AC Cont), and a switching signal LR, and supplies them to the display panel 351.

In the sending-receiving circuit 362, signals that are as radio waves sent and received by an antenna 378 are processed, and specifically, high-frequency circuits such as an isolator, a band pass filter, a VCO (Voltage Controlled Oscillator), an LPF (Low Pass Filter), a coupler, and a balun are included. In the sending-receiving circuit 362, a signal including audio information among signals that are sent and received is sent to the audio processing circuit 361 in accordance with an instruction from the CPU 358.

The signal including the audio information, which has been sent in accordance with the instruction of the CPU 358, is demodulated into an audio signal in the audio processing circuit 361, and sent to a speaker 377. In addition, an audio signal sent from a microphone 376 is modulated in the audio processing circuit 361, and sent to the sending-receiving circuit 362 in accordance with an instruction from the CPU 358.

The controller 357, the CPU 358, the power supply circuit 360, the audio processing circuit 361, and the memory 359 can be mounted as a package of this embodiment. This embodiment can be applied to any circuit other than high-frequency circuits such as an isolator, a band pass filter, a VCO (Voltage Controlled Oscillator), an LPF (Low Pass Filter), a coupler, and a balun.

Figure 20:
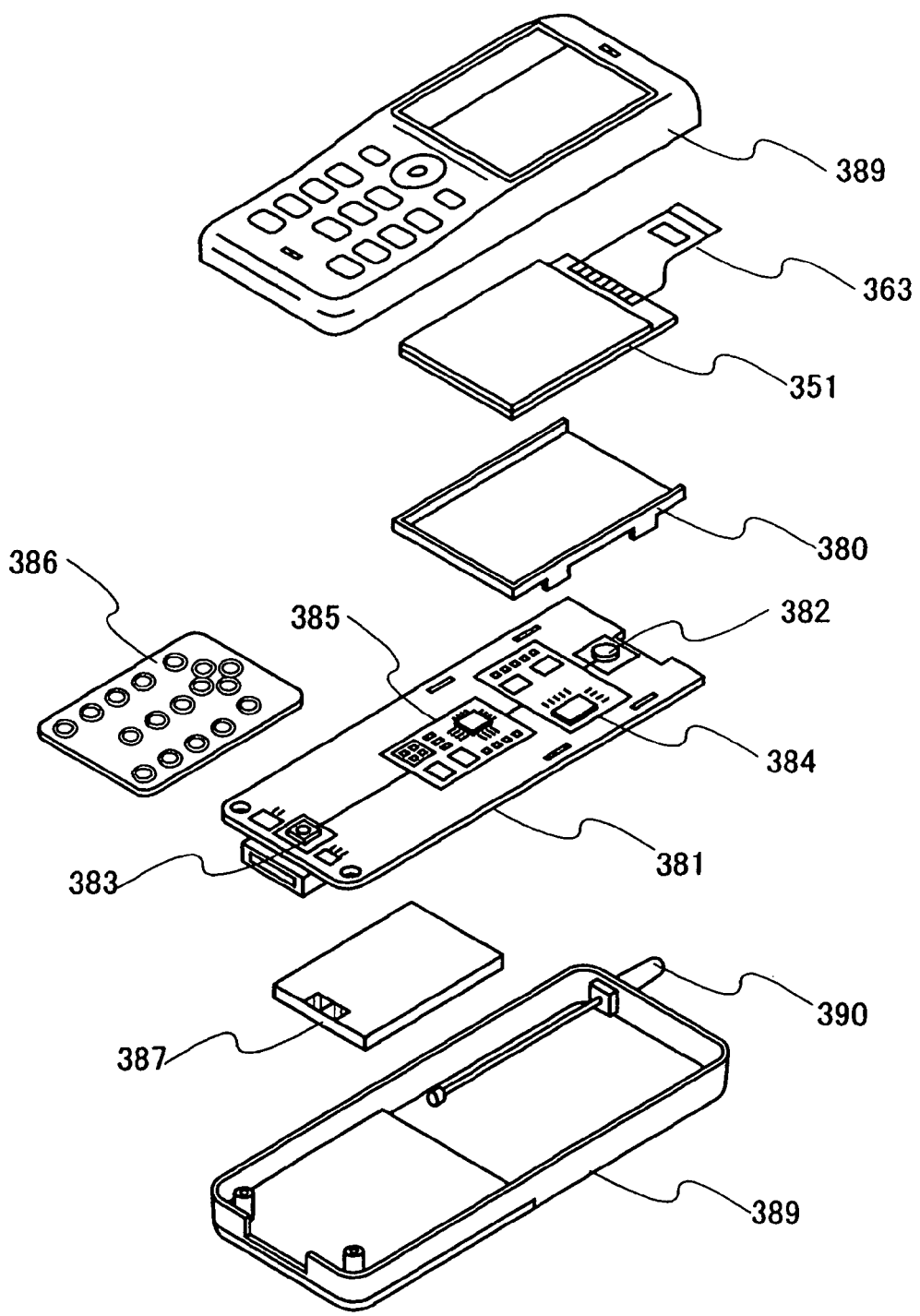
FIG. 20 is a view illustrating an example of an electronic appliance to which the present invention is applied.

FIG. 20 shows one mode of a cellular phone including the module shown in FIGS. 18 and 19. The display panel 351 is incorporated in a housing 380 so as to be detachable. The shape and size of the housing 380 can be changed as appropriate depending on the size of the display panel 351. The housing 380 fixing the display panel 351 is attached to a printed board 381 to be assembled as a module.

The display panel 351 is connected to the printed board 381 via the FPC 363. Over the printed board 381, a speaker 382, a microphone 383, a sending/receiving circuit 384, and a signal processing circuit 385 including a CPU, a controller, and the like are formed. This module is combined with an input unit 386, a battery 387, and an antenna 390, and is put in a chassis 389. The pixel portion of the display panel 351 is arranged so as to be seen from a window formed in the housing 389.

The cellular phone of this embodiment can be changed in various modes depending on the function or application thereof. For example, even when the cellular phone is provided with a plurality of display panels or when the housing is divided into a plurality of parts as appropriate and can be opened and closed with a hinge, the above-described operation effect can be obtained.

When the present invention is used for the cellular phones shown in FIG. 18, FIG. 19, and FIG. 20, a cellular phone having a highly durable display device in which decreasing rate of luminance is slow can be obtained.

Figure 21A:
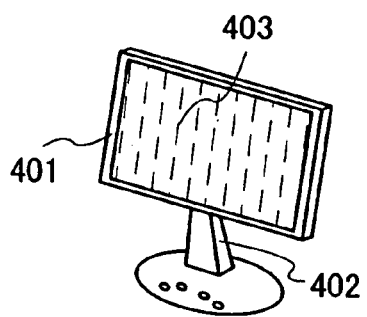
FIGS. 21A to 21E are views each illustrating an example of an electronic appliance to which the present invention is applied.

FIG. 21A shows an EL display in which a chassis 401, a supporting base 402, a display portion 403, and the like are included. The present invention can be applied to the display portion 403 with the use of structures of the EL module shown in FIG. 15 and the display panel shown in FIG. 18.

By the present invention, a display having a highly durable display device in which decreasing rate of luminance is slow can be obtained.

Figure 21B:
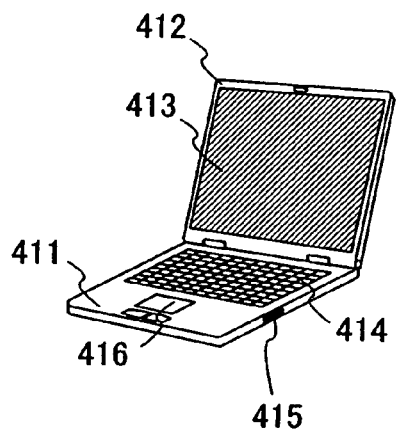

FIG. 21B shows a computer in which a main body 411, a chassis 412, a display portion 413, a keyboard 414, an external connection port 415, a pointing device 416, and the like are included. The present invention can be applied to the display portion 413 with the use of the structures of the EL module shown in FIG. 15 and the display panel shown in FIG. 18.

By the present invention, a computer having a highly durable display device in which decreasing rate of luminance is slow can be obtained.

Figure 21C:
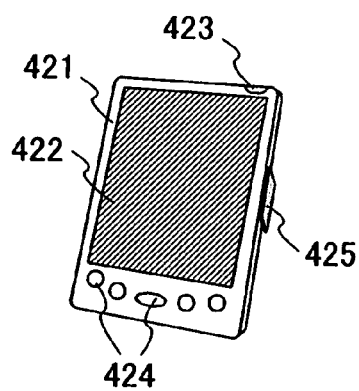

FIG. 21C shows a portable computer in which a main body 421, a display portion 422, a switch 423, operation keys 424, an infrared port 425, and the like. The present invention can be applied to the display portion 422 with the use of the structures of the EL module shown in FIG. 15 and the display panel shown in FIG. 18.

By the present invention, a computer having a highly durable display device in which decreasing rate of luminance is slow can be obtained.

Figure 21D:
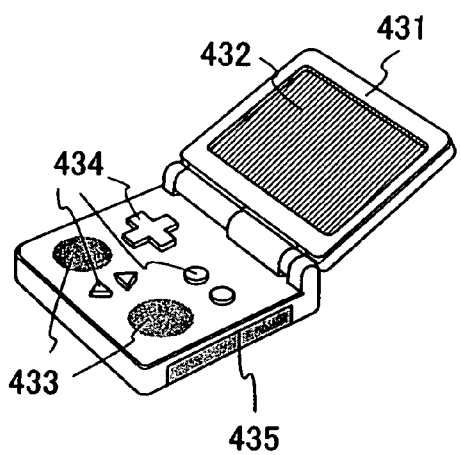

FIG. 21D shows a portable game machine in which a chassis 431, a display portion 432, speaker portions 433, operation keys 434, a recording medium insert portion 435, and the like. The present invention can be applied to the display portion 432 with the use of the structures of the EL module shown in FIG. 15 and the display panel shown in FIG. 18.

By the present invention, a game machine having a highly durable display device in which decreasing rate of luminance is slow can be obtained.

Figure 21E:
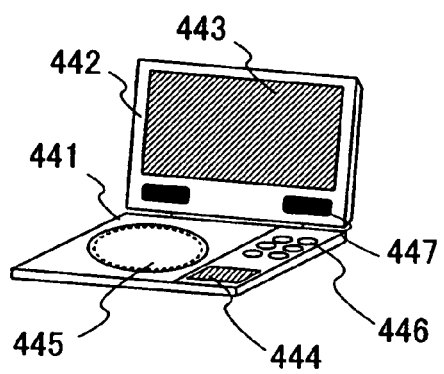

FIG. 21E shows a portable image reproducing device (specifically, a DVD reproducing device) provided with a recoding medium, in which a main body 441, a chassis 442, a first display portion 443, a second display portion 444, a storage medium reading portion 445, operation keys 446, speaker portions 447, and the like are included. It is to be noted that the recording medium includes a DVD or the like.

The first display portion 443 mainly displays image information and the second display portion 444 mainly displays textual information. The present invention can be applied to the first display portion 443 and the second display portion 444 with the use of the structures of the EL module shown in FIG. 15 and the display panel shown in FIG. 18. It is to be noted that the image reproducing device provided with a recording medium includes a home game machine and the like.

By the present invention, an image reproducing device having a highly durable display device in which decreasing rate of luminance is slow can be obtained.

For each of display devices used for the electronic appliances, a heat-resistant plastic substrate can be used as well as a glass substrate, depending on the size, strength, or the intended purpose. Accordingly, further reduction in weight can be achieved.

It is to be noted that the examples shown in this embodiment are just examples, and the present invention is not limited to these applications.

This embodiment can be implemented in free combination with Embodiment Mode and other embodiments.

The present invention can be used for a semiconductor device having a display device in which a plurality of pixels are included. By the present invention, a semiconductor device having a highly durable display device in which luminance slowly decreases can be obtained.

This application is based on Japanese Patent Application serial no. 2006-164873 filed in Japan Patent Office on Jun. 14, 2006, the entire contents of which are hereby incorporated by reference.

The invention claimed is:

1. A method for manufacturing a semiconductor device, comprising the steps of:
    forming a first electrode over a substrate;
    forming a first insulating layer containing polysilane over the substrate and the first electrode;
    pressing a mold against the first insulating layer to form an opening in the first insulating layer, the opening reaching the first electrode;
    separating the mold from the first insulating layer in which the opening is formed;
    hardening the first insulating layer in which the opening is formed, thereby forming a second insulating layer comprising silicon oxide;
    forming a light-emitting layer over the first electrode and the second insulating layer; and
    forming a second electrode over the light-emitting layer,
    wherein the first insulating layer is hardened by oxygen plasma.

2. The method for manufacturing a semiconductor device according to claim 1, wherein the hardening is performed by UV light irradiation and heating.

3. The method for manufacturing a semiconductor device according to claim 1,
wherein the mold comprises a metal material or an insulating material, and
wherein a depression is formed on a surface of the mold.

4. The method for manufacturing a semiconductor device according to claim 1, wherein a surface of the first insulating layer in which the opening is formed is hardened before the hardening.

5. The method for manufacturing a semiconductor device according to claim 1, wherein the light-emitting layer comprises an organic light-emitting material.

6. The method for manufacturing a semiconductor device according to claim 1, wherein the light-emitting layer comprises an inorganic light-emitting material.

7. The method for manufacturing a semiconductor device according to claim 1, wherein the polysilane comprises a Si—Si bond and a Si—C bond.

8. The method for manufacturing a semiconductor device according to claim 1, wherein heating is performed during pressing the mold against the first insulating layer.

9. The method for manufacturing a semiconductor device according to claim 1, wherein the mold is separated from the first insulating layer by application of ultrasonic wave to the first insulating layer.

10. The method for manufacturing a semiconductor device according to claim 1, wherein the polysilane comprises a structure represented by one of the following formulae (1) to (3):

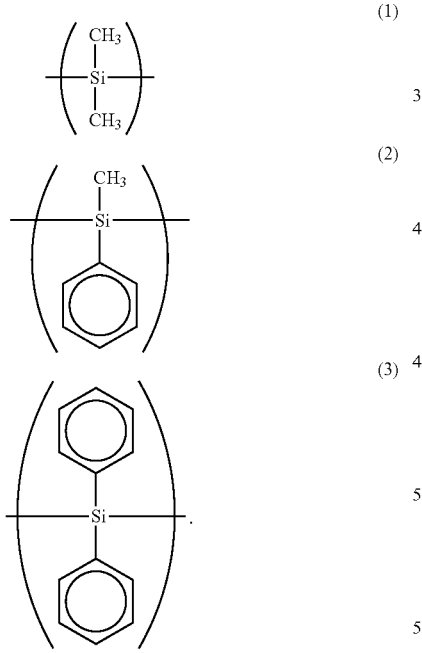

11. A method for manufacturing a semiconductor device, comprising the steps of:
forming a first electrode over a substrate;
forming a first insulating layer containing polysilane over the substrate and the first electrode;
pressing a mold against the first insulating layer to form an opening in the first insulating layer, the opening reaching the first electrode;
separating the mold from the first insulating layer in which the opening is formed;
hardening the first insulating layer in which the opening is formed, thereby forming a second insulating layer comprising silicon oxide;
forming a hole transporting layer, a light-emitting layer comprising an organic light-emitting material, and an electron transporting layer over the first electrode and the second insulating layer; and
forming a second electrode over the light-emitting layer,
wherein the first insulating layer is hardened oxygen plasma.

12. The method for manufacturing a semiconductor device according to claim 11, wherein the hardening is performed by UV light irradiation and heating.

13. The method for manufacturing a semiconductor device according to claim 11,
wherein the mold comprises a metal material or an insulating material, and
wherein a depression is formed on a surface of the mold.

14. The method for manufacturing a semiconductor device according to claim 11, wherein a surface of the first insulating layer in which the opening is formed is hardened before the hardening.

15. The method for manufacturing a semiconductor device according to claim 11, wherein the polysilane comprises a Si—Si bond and a Si—C bond.

16. The method for manufacturing a semiconductor device according to claim 11, wherein heating is performed during pressing the mold against the first insulating layer.

17. The method for manufacturing a semiconductor device according to claim 11, wherein the mold is separated from the first insulating layer by application of ultrasonic wave to the first insulating layer.

18. The method for manufacturing a semiconductor device according to claim 11, wherein the polysilane comprises a structure represented by one of the following formulae (1) to (3):

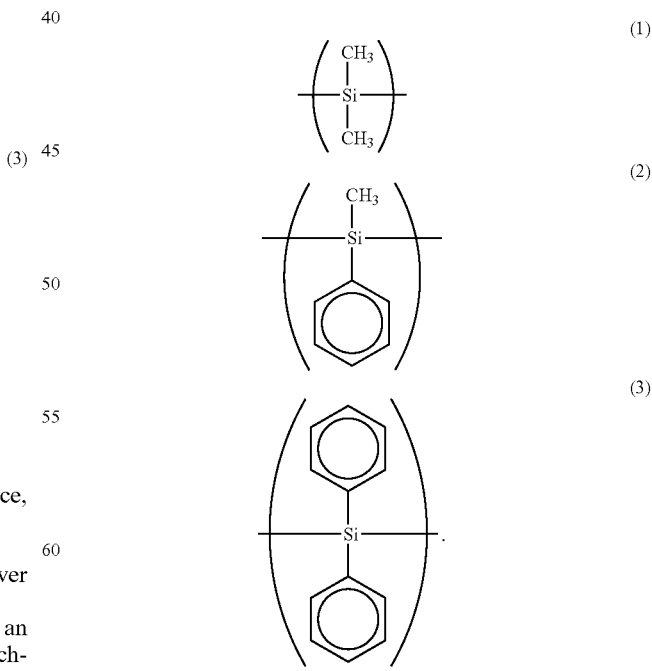

* * * * *